United States Patent
Maeda

(10) Patent No.: US 8,649,223 B2
(45) Date of Patent: Feb. 11, 2014

(54) SEMICONDUCTOR STORAGE DEVICE

(75) Inventor: Takashi Maeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 13/403,294

(22) Filed: Feb. 23, 2012

(65) Prior Publication Data

US 2012/0243326 A1  Sep. 27, 2012

(30) Foreign Application Priority Data

Mar. 23, 2011  (JP) ................................. 2011-065031

(51) Int. Cl.
*G11C 11/34* (2006.01)

(52) U.S. Cl.
USPC ................................. 365/185.21; 365/185.24

(58) Field of Classification Search
USPC ........................................ 365/185.21, 185.24
See application file for complete search history.

(56) References Cited

U.S. PATENT DOCUMENTS

| | | | |
|---|---|---|---|
| 7,046,568 B2 | 5/2006 | Cernea | |
| 7,196,931 B2 | 3/2007 | Cernea et al. | |
| 8,068,382 B2 * | 11/2011 | Pyeon | 365/230.06 |
| 8,279,669 B2 * | 10/2012 | Fujita et al. | 365/185.03 |
| 2003/0002370 A1 * | 1/2003 | Cowles | 365/201 |
| 2003/0035316 A1 * | 2/2003 | Tanaka et al. | 365/185.03 |
| 2006/0083068 A1 * | 4/2006 | Ahn et al. | 365/185.18 |
| 2009/0147581 A1 * | 6/2009 | Isobe | 365/185.09 |
| 2010/0165493 A1 | 7/2010 | Fukino et al. | |
| 2010/0202228 A1 * | 8/2010 | Tokiwa | 365/200 |
| 2010/0207195 A1 | 8/2010 | Fukuzumi et al. | |
| 2010/0214837 A1 | 8/2010 | Sako et al. | |
| 2010/0271882 A1 * | 10/2010 | Takeuchi | 365/185.18 |
| 2010/0302863 A1 * | 12/2010 | Ho et al. | 365/185.21 |
| 2011/0038206 A1 * | 2/2011 | Fujita et al. | 365/185.03 |
| 2011/0096598 A1 * | 4/2011 | Takeuchi et al. | 365/185.03 |
| 2011/0157996 A1 | 6/2011 | Honda | |
| 2012/0170356 A1 * | 7/2012 | Vogelsang | 365/149 |

FOREIGN PATENT DOCUMENTS

JP  2010-198698  9/2010

OTHER PUBLICATIONS

H. Tanaka, et al. "Bit cost Scalable Technology with Punch and Plug Process for Ultra High Density Flash Memory", Symposium on VLSI Technology Digest of Technical Papers, 2007, pp. 14-15.

Ryota Katsumata, et al., "Pipe-shaped BiCS Flash Memory with 16 Stacked Layers and Multi-Level-Cell Operation for Ultra High Density Storage Devices", Symposium on VLSI Technology Digest of Technical Papers, 2009, pp. 136-137.

Takashi Maeda, et al., "Multi-stacked 1G cell/layer Pipe-shaped BiCS Flash Memory", Symposium on VLSI Circuits Digest of Technical Papers, 2009, pp. 22-23.

* cited by examiner

*Primary Examiner* — Michael Tran
(74) *Attorney, Agent, or Firm* — Oblon, Spivak, McClelland, Maier & Neustadt, L.L.P.

(57) ABSTRACT

According to one embodiment, a device includes transistors each with a path connected to a bit line, and circuits each includes a switch, the circuit being connected to the bit line. The device includes a amplifier connected to the transistor and to the circuit, and a latch connected to the amplifier to hold first data before read is carried out on a cell and to hold second data if a current equal to or a larger than a predetermined value flows via the bit line. In the device, the switch is turned on or off depending on data held in another latch located adjacently in a direction of the word lines, to control a connection between the bit line and connected to another bit line the amplifier via the circuit.

19 Claims, 16 Drawing Sheets

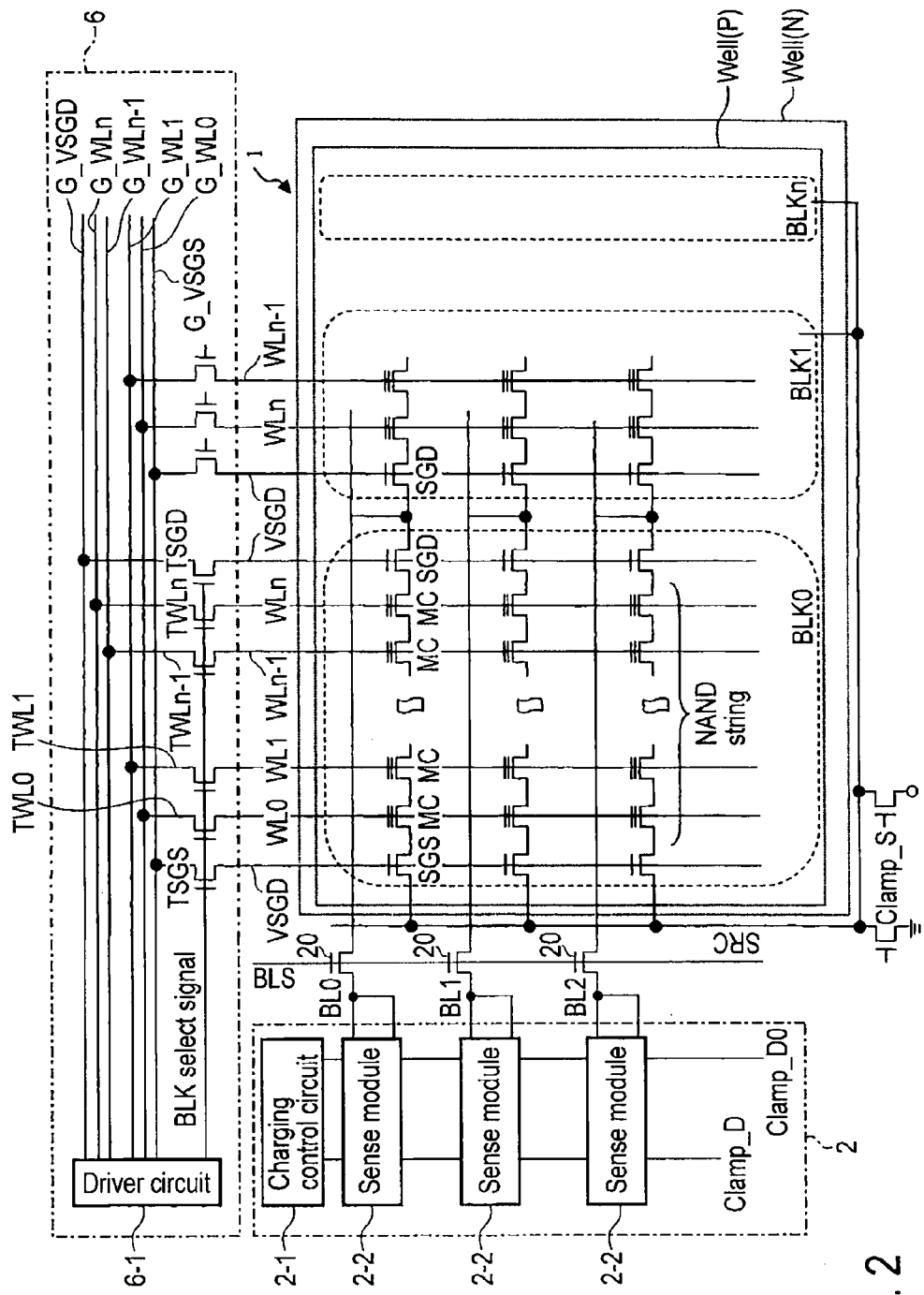
F I G. 2

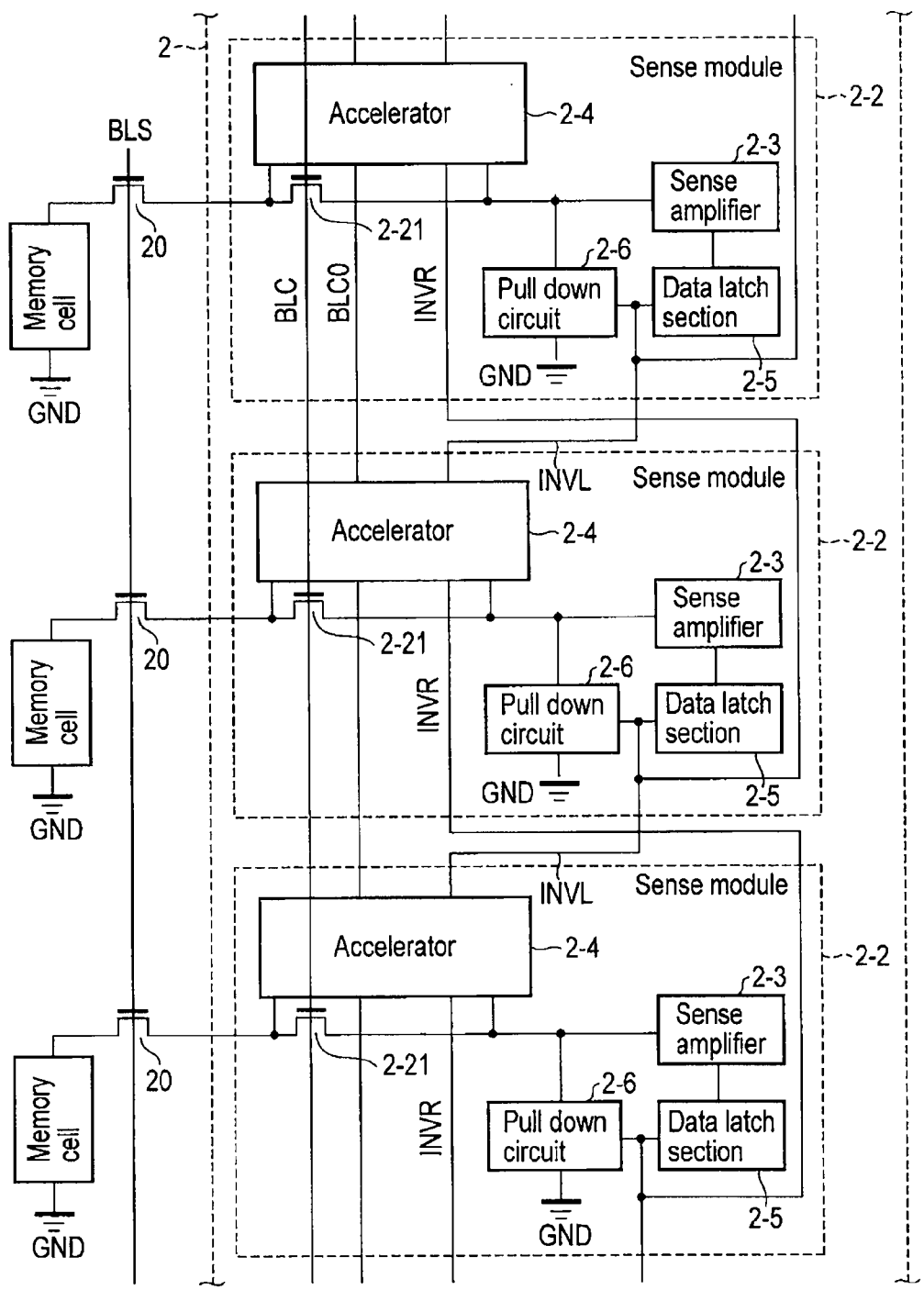
F I G. 3

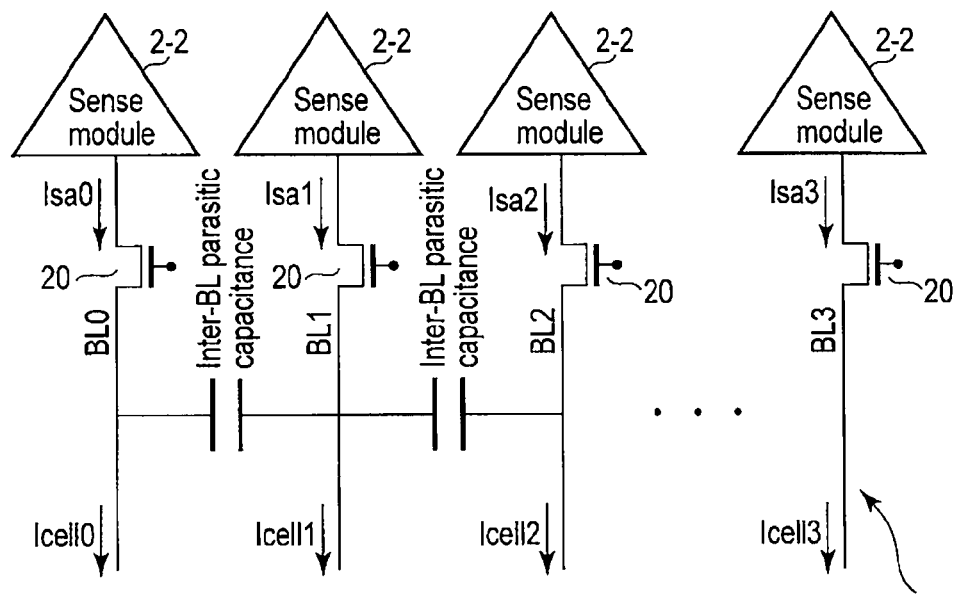
F I G. 5
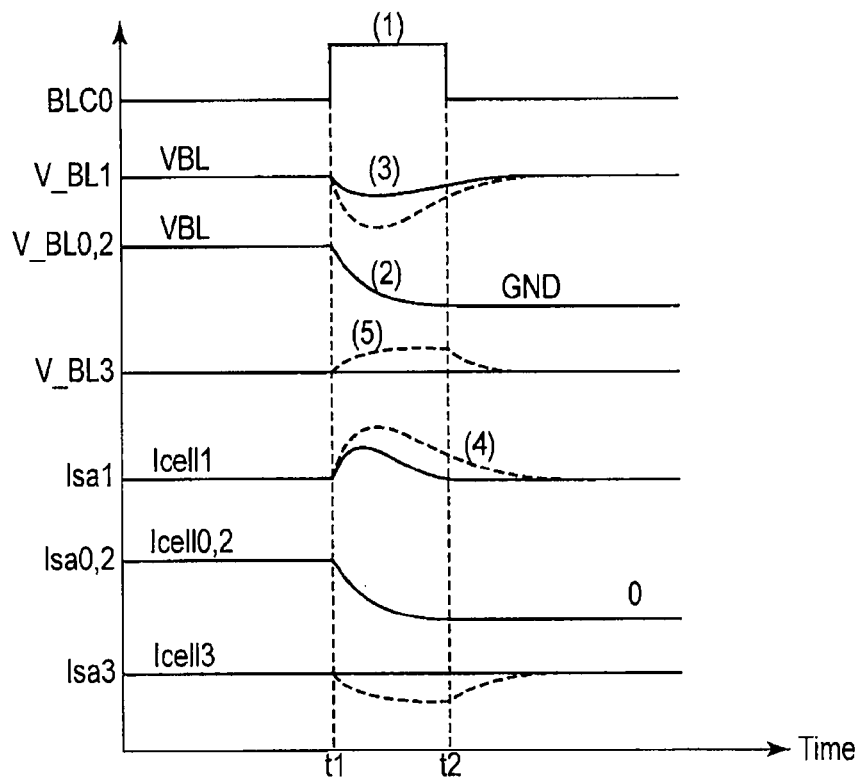
F I G. 6

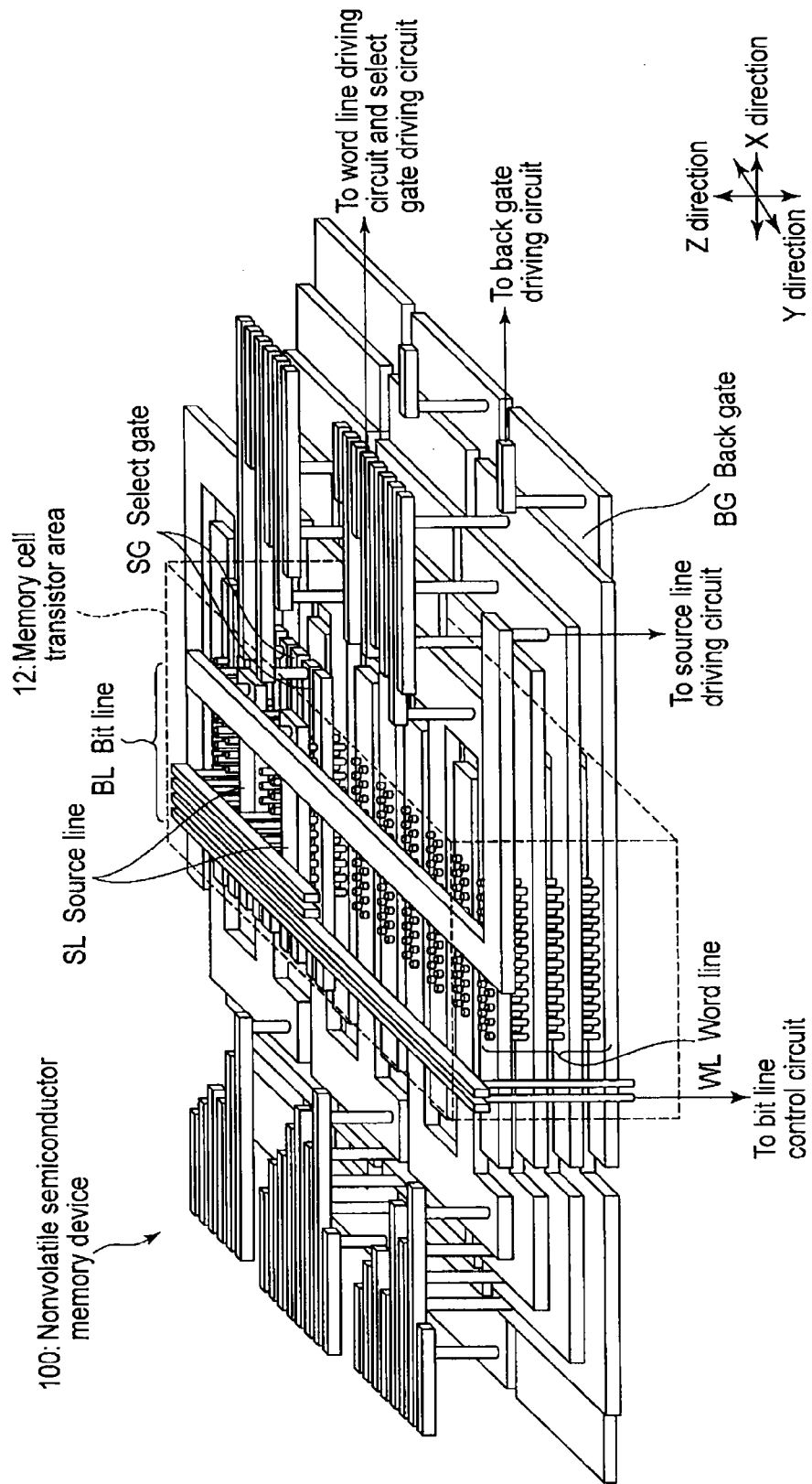
F I G. 13

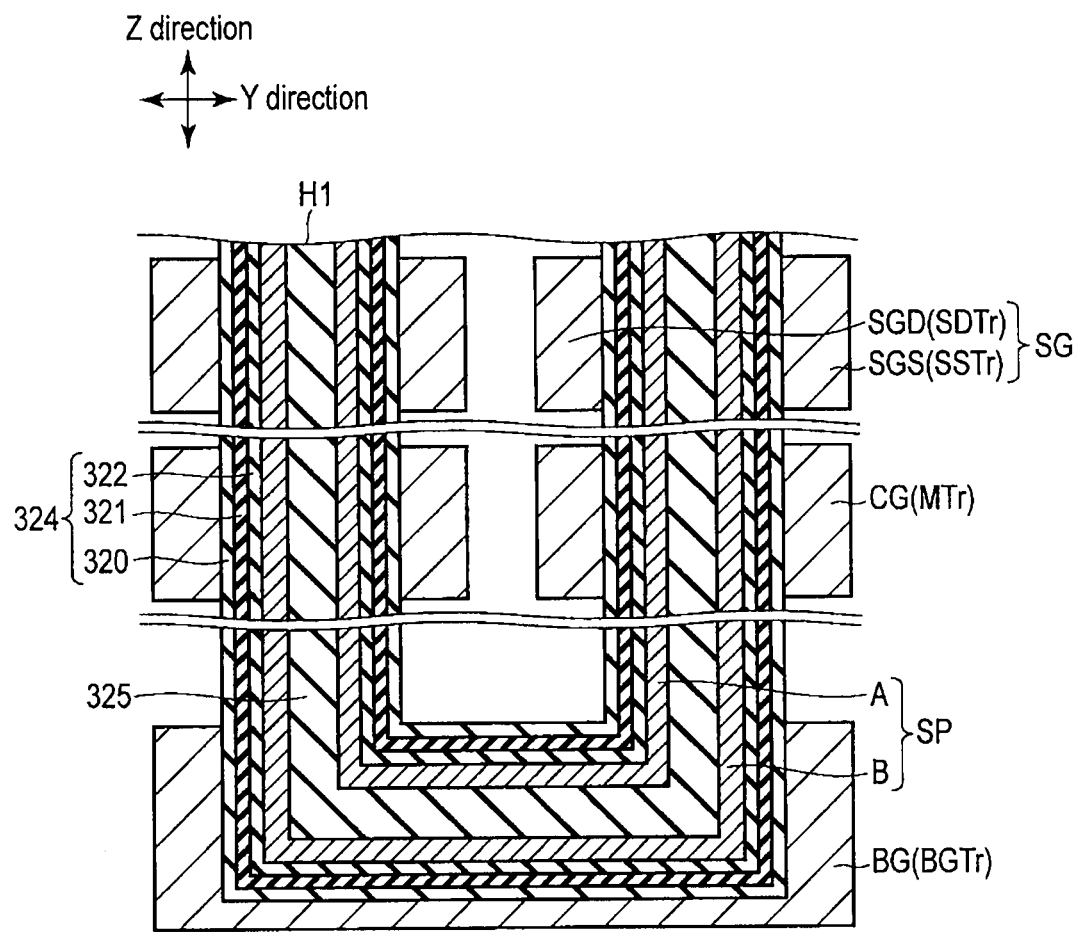
F I G. 1 5

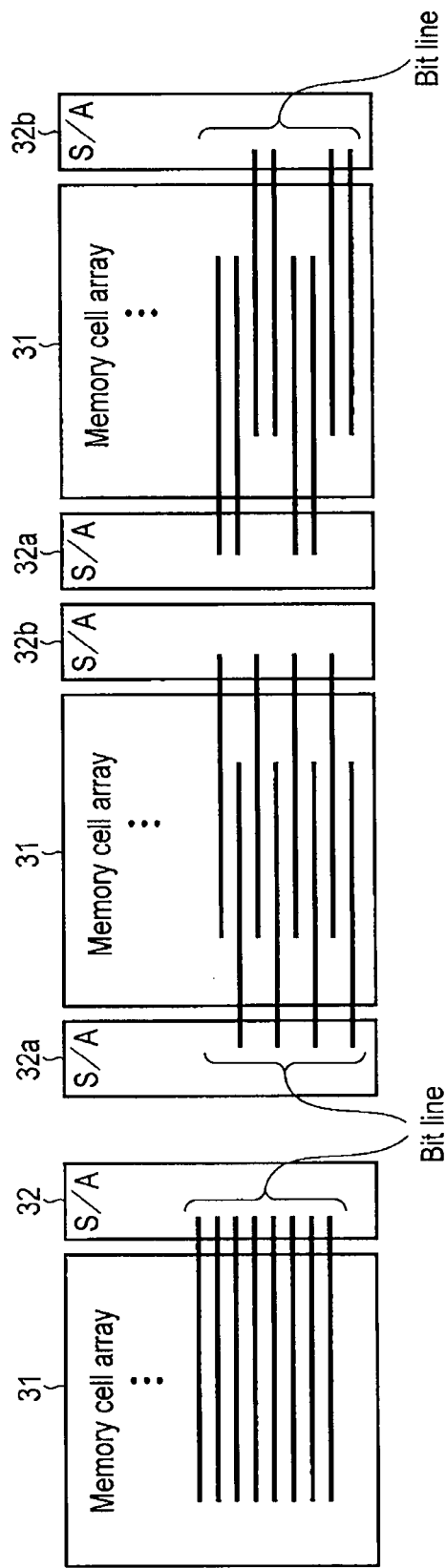

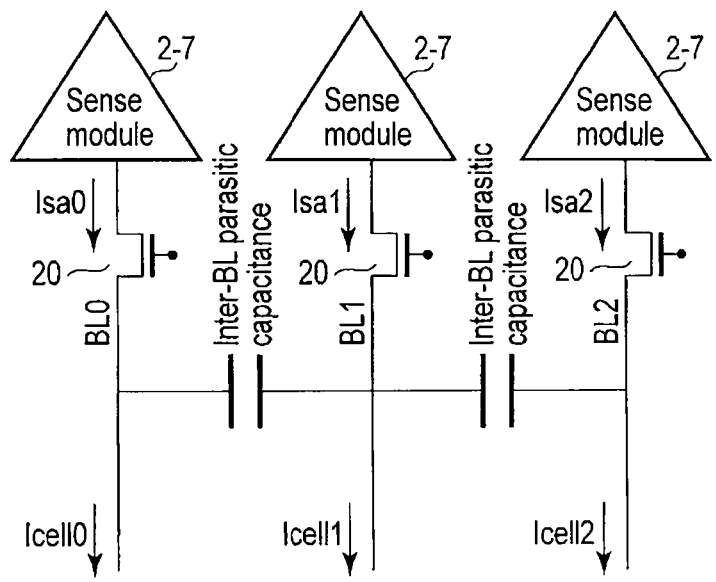
F I G. 2 2
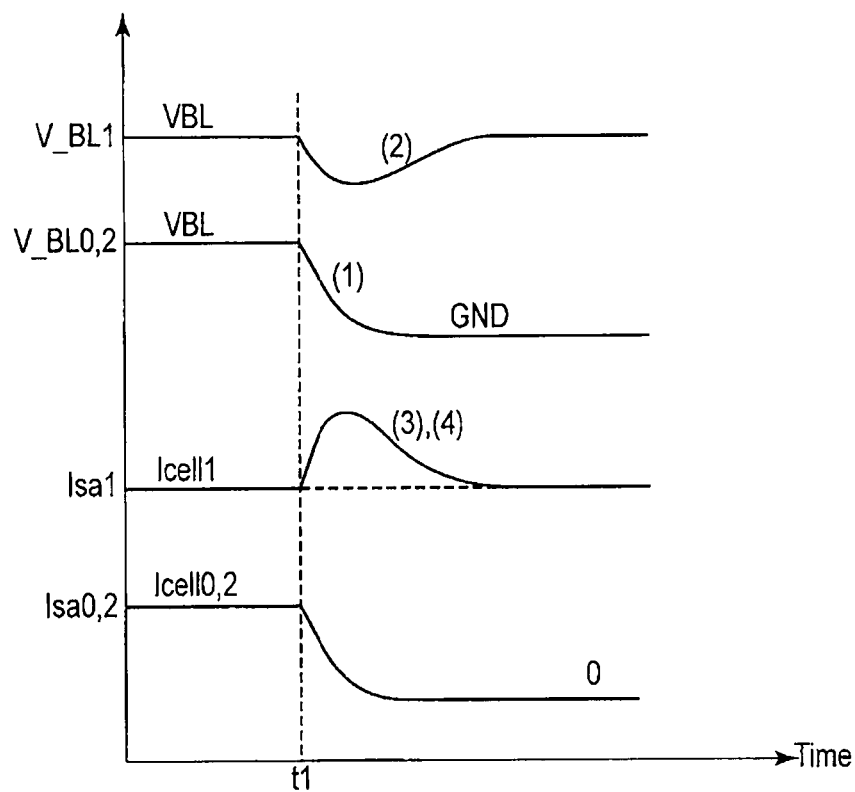
F I G. 2 3

SEMICONDUCTOR STORAGE DEVICE

CROSS-REFERENCE TO RELATED APPLICATIONS

This application is based upon and claims the benefit of priority from prior Japanese Patent Application No. 2011-065031, filed Mar. 23, 2011, the entire contents of which are incorporated herein by reference.

FIELD

Embodiments described herein relate generally to a semiconductor storage device.

BACKGROUND

A read speed for a NAND flash memory is conventionally controlled mainly by a recovery time for bit lines. The recovery time is a time required to recover the potential of a bit line to an original value when the potential is disturbed. The recovery time depends on the capacitive coupling between the bit line and an adjacent bit line or a second adjacent bit line, or the charging capability of the bit line. Increasing miniaturization has led to a decrease in cell current and an increase in mutual interference between the bit line and the adjacent bit line or second adjacent bit line. This has caused the read characteristics of NAND flash memories to be further degraded.

Furthermore, read operations include writes generally performed as internal operations of a NAND flash memory or threshold checks (hereinafter referred to as verifications) carried out on memory cells during erase operations. Thus, not only the read characteristics but also the write or erase characteristics of the NAND flash memory tend to be degraded.

BRIEF DESCRIPTION OF THE DRAWINGS

FIG. 2 is a circuit diagram schematically showing the basic configuration of the NAND flash memory according to the first embodiment;

FIG. 3 is a circuit diagram schematically showing a basic configuration of a bit line control circuit according to the first embodiment;

FIG. 5 is a circuit diagram schematically showing sense modules and bit lines according to the first embodiment;

FIG. 6 is a timing chart illustrating a charging operation of a semiconductor device according to the first embodiment;

FIG. 13 is a perspective view schematically showing a basic structure of a three-dimensional stacked NAND flash memory according to the seventh embodiment;

FIG. 15 is a diagram showing the structure of NAND cell unit according to a seventh embodiment;

FIG. 16A is a block diagram schematically showing the positional relationship between a bit line control circuit and a memory cell array where the bit line control circuit is arranged on one side of the memory cell array;

FIG. 16B is a block diagram schematically showing the positional relationship between the bit line control circuit and the memory cell array where the bit line control circuit is arranged on each of the opposite sides of the memory cell array and where every other bit line BL is connected to an input side of the same bit line control circuit;

FIG. 16C is a block diagram schematically showing the positional relationship between the bit line control circuit and the memory cell array where the bit line control circuit is arranged on each of the opposite sides of the memory cell array and where every two bit lines BL are alternately connected to the input sides of the two bit line control circuits;

FIG. 22 is a circuit diagram schematically showing sense modules and bit lines according to the comparative example; and FIG. 23 is a timing chart illustrating a charging operation of a semiconductor device according to the comparative example.

DETAILED DESCRIPTION

In general, according to one embodiment, a semiconductor storage device comprises electrically rewritable memory cells, word lines each electrically connected (also referred to simply as "connected") to gates of the memory cells, and bit lines each connected to one end of a corresponding one of the memory cells. The semiconductor storage device comprises first transistors each with a current path connected to the corresponding bit line at one end thereof, and voltage controllers each comprising a second transistor and a switch circuit, the second transistor electrically connected to the switch circuit, the voltage controller being connected to the corresponding bit line. Furthermore, the semiconductor storage device comprises a sense amplifier connected to another end of the current path in the corresponding first transistor and to the corresponding voltage controller, and a data latch section electrically connected to the corresponding sense amplifier to hold first data before read is carried out on the corresponding memory cell and to hold second data if a current equal to or a larger than a predetermined value flows via the corresponding bit line. Moreover, the semiconductor storage device comprises a pull down circuit configured to reduce a potential of the corresponding bit line to a reset potential if the second data is held in the corresponding data latch section, and a charging control circuit configured to apply predetermined potentials to gates of the corresponding first transistor and second transistor when read is carried out on the corresponding memory cell. In the semiconductor device, the switch circuit is turned on or off depending on data held in another data latch section connected to another bit line located adjacently in a direction of the word lines, to control a connection between the bit line and the sense amplifier via the voltage controller.

Embodiments will be described below with reference to the drawings. It will be understood that when an element is referred to as being "electrically connected to" or "connected to" another element, it can be not only directly connected but also connected to the other element or intervening elements may be present.

First Embodiment

<General Configuration of the NAND Flash Memory>

Figure 1:
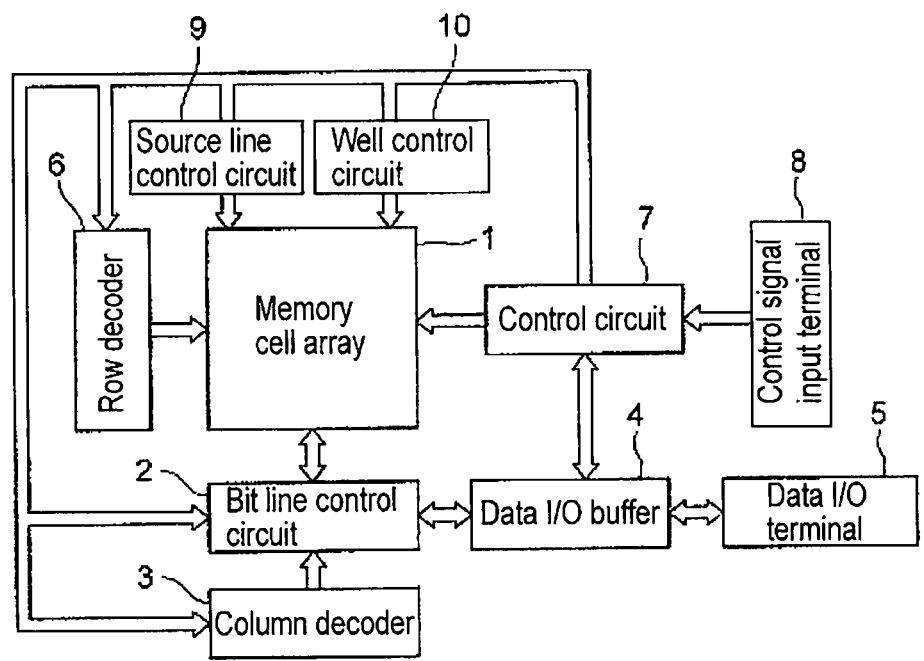
FIG. 1 is a block diagram schematically showing a basic configuration of a NAND flash memory according to a first embodiment.

A configuration of a NAND flash memory according to a first embodiment will be described in brief with reference to FIG. 1 and FIG. 2. FIG. 1 is a block diagram schematically showing a basic configuration of a NAND flash memory 100 according to the first embodiment. Furthermore, FIG. 2 is a circuit diagram schematically showing the basic configuration of the NAND flash memory 100 according to the first embodiment including a memory cell array 1, a bit line control circuit 2, and a row decoder 6 as shown in FIG. 1.

As shown in FIG. 1, the NAND flash memory 100 comprises the memory cell array 1, the bit line control circuit 2, a column decoder 3, a data I/O buffer 4, a data I/O terminal 5, the row decoder 6, a control circuit 7, a control signal input terminal 8, a source line control circuit 9, and a well control circuit 10.

The memory cell array 1 includes a plurality of bit lines BL, a plurality of word lines WL, and a source line SRC. The memory cell array 1 comprises a plurality of blocks BLK each with electrically rewritable memory cells MC arranged in a matrix. Each of the memory cells MC is formed of, for example, a stack structure including a control gate electrode and a floating gate electrode. The memory cell MC stores a binary value of multi-valued data depending on a variation in a threshold of a transistor determined by the amount of charge injected into the floating gate electrode. Alternatively, the memory cell MC may have a MONOS (Metal-Oxide-Nitride-Oxide-Silicon) structure in which electrons are trapped in a nitride film.

The memory cell array 1 connects to a bit line control circuit 2 configured to control the voltage of each of the bit lines BL via a corresponding bit line select NMOS transistor 20, and a row decoder 6 configured to control the voltage of each of the word lines WL. For a data erase operation, the row decoder 6 selects any of the blocks BL, with the remaining blocks BLK unselected.

The bit line control circuit 2 comprises a charging control circuit 2-1 configured to control clamping NMOS transistors (also referred to as clamp transistors) described below, and sense modules 2-2. Each of the sense modules 2-2 comprises a sense amplifier (S/A) 2-3 configured to sense and amplify the voltage of the corresponding bit line BL in the memory cell array 1, a data storage circuit (data latch section) 2-5 also serving as a data latch circuit for latching data to be written, a pull down circuit 2-6 configured to reduce the potential of the bit line to a ground potential (GND), and an accelerator (voltage controller) 2-4 configured to accelerate charging of the corresponding bit line depending on the potential of the adjacent bit line.

The bit line control circuit 2 reads data from the corresponding memory cell MC in the memory cell array 1 via the bit line BL, detects the state of the memory cell MC via the bit line BL, or applies a write control voltage to the memory cell MC via the bit line BC to write data to the memory cell MC.

Furthermore, a column decoder 3 and a data I/O buffer 4 are connected to the bit line control circuit 2. The column decoder 3 selects any of the data storage circuits in the bit line control circuit 2. Data read from the memory cell MC into the data storage circuit is output to an external device through a data I/O terminal 5 via the data I/O buffer 4.

Additionally, write data externally input to the data I/O terminal 5 is stored, via the data I/O buffer 4, in the data storage circuit selected by the column decoder 3. In addition to the write data, various commands for write, read, erase, and status read as well as addresses are input through the data I/O terminal 5.

The row decoder 6 is connected to the memory cell array 1. The row decoder 6 applies a voltage required for a read operation, a write operation, or an erase operation, to the word lines WL and select gate lines VSGS and VSGD. Furthermore, the row decoder 6 includes a driver control circuit 6-1 connected to a plurality of control lines described below in order to selectively apply a voltage to the word lines WL and the select gate lines VSGS and VSGD.

The source line control circuit 9 is connected to the memory cell array 1. The source line control circuit 9 controls the voltage of a source line SRC.

The well control circuit 10 is connected to the memory cell array 1. The well control circuit 10 controls the voltage of a semiconductor substrate (well) with the memory cells MC formed thereon.

The control circuit 7 controls the memory cell array 1, the bit line control circuit 2, the column decoder 3, the data I/O buffer 4, the row decoder 6, the source line control circuit 9, and the well control circuit 10. The control circuit 7 is assumed to include a booster circuit (not shown in the drawings) configured to raise a power supply voltage. The control circuit 7 allows the booster circuit to raise the power supply voltage as required. The control circuit 7 then supplies the raised power supply voltage to the bit line control circuit 2, the column decoder 3, the data I/O buffer 4, the row decoder 6, the source line control circuit 9, and the well control circuit 10.

The control circuit 7 performs control operations in accordance with control signals externally input via the control signal input terminal 9 (a command latch enable signal CLE, an address latch enable signal ALE, a ready/busy signal RY/BY, and the like) and commands input through the data I/O terminal 5 via the data I/O buffer 4. That is, in accordance with the control signal and the command, the control circuit 7 generates and supplies a desired voltage to each section of the memory cell array 1 for data programming, verification, read, or erase).

Here, as shown in FIG. 2, the memory cell array 1 comprises blocks BLK0, BLK1, . . . BLKn each formed of NAND strings connected in series and each comprising a plurality of the memory cells MC. The NAND string comprises n (for example, 64) memory cells MC connected in series. A drain side select MOS transistor SGD is connected to one end of the NAND string. A source side select MOS transistor SGD is connected to the other end of the NAND string. Furthermore, the source side select MOS transistor SGS is connected to the source line SRC.

Control gate electrodes of the memory cells MC arranged in each row are connected to the word lines WL0 to WLn, respectively. In FIG. 2, for simplification, only the word lines WL0, WL1, WLn−1 and WLn are shown, and the word lines arranged between the WL1 and WLn−1 are omitted. If the plurality of word lines need not particularly be distinguished from one another, the word lines may be simply expressed as a word line WL. A gate of the drain side select MOS transistor SGD is connected to the drain side select gate line VSGD. A gate of the source side select MOS transistor SGS is connected to the source side select gate line VSGS.

The row decoder 6 comprises a driver circuit 6-1, a plurality of transfer NMOS transistors TSGS, TSGD, and TWL0 to TWLn corresponding to the blocks BLK, and control lines G_VSGS, G_VSGD, G_WL0, G_WL1, . . . G_WLn−1, and G_WLn. Drains of the transfer NMOS transistors TSGS and TSGD are connected to the source side select gate line VSGS and the drain side select gate line VSGD, respectively. Drains of the transfer NMOS transistors TWL0 to TWLn are connected to the word lines WL0 to WLn, respectively, connected to control gates of the respective memory cells MC.

Sources of the transfer NMOS transistors TSGS, TSGD, and TWL0 to TWLn are connected to the control lines G_VSGS, G_VSGDE, G_WL0, G_WL1, . . . G_WLn−1, and G_WLn, respectively, connected to the driver circuit 6-1. A block select signal corresponding to an external address is input to gates of the transfer NMOS transistors TSGS, TSGD, and TWL0 to TWLn. In accordance with an output from the control circuit 7, the driver circuit 6-1 controls the gate voltages and source voltages of the transfer NMOS transistors TSGS, TSGD, and TWL0 to TWLn.

That is, by allowing the driver circuit 6-1 to control the gate voltages and source voltages of the transfer NMOS transistors, the row decoder 6 selects any block BLK in the memory cell array 1 and performs a write operation or a read operation on the selected block BLK.

On the other hand, the bit lines BL0, BL1, and BL2 are arranged orthogonally to the word lines WL0 to WLn and the source line SRC. FIG. 2 specifically shows only three bit lines BL0, BL1, and BL2. However, of course, the number of bit lines is not limited to this value. Any number of bit lines may be provided; 2,048 bit lines may be arranged parallel to one another in one block BLK.

The sense modules 2-2 in the bit line control circuit 2 are connected to the bit lines BL0, BL1, and BL2, respectively, via current paths in the respective bit line select transistors 20. The sense module 2-2 senses the potential of the bit line BL connected to the sense module 2-2 or controls the potential of the bit line BL. Furthermore, a gate of the bit line select transistor 20 is provided with a bit line select signal BLS.

<Configuration of the Bit Line Control Circuit>

Now, a basic configuration of the bit line control circuit 2 according to the present embodiment will be described in brief with reference to FIG. 3. FIG. 3 is a circuit diagram schematically showing the basic configuration of the bit line control circuit 2 according to the present embodiment.

As shown in FIG. 3, the bit line control circuit 2 comprises the sense module 2-2 for each bit line BL. The sense module 2-2 comprises a bit line-clamping NMOS transistor 2-21, a sense amplifier 2-3, an accelerator 2-4, a data latch section 2-5, and a pull down circuit 2-6. Furthermore, the sense module 2-2 is connected to the memory cell via the bit line select transistor 20. The accelerator 2-4 of the sense module 2-2 connects to INVL from the data latch section 2-5 of the adjacent sense modules 2-2 or INVR from the data latch section 2-5 of another adjacent sense module 2-2. A bit select signal BLS is input to a gate of the bit line select transistor 20 to controllably turn on and off the memory cell MC and the sense module 2-2. The signal BLS is provided by the control circuit 7.

<Configuration of the Sense Module>

Figure 4:
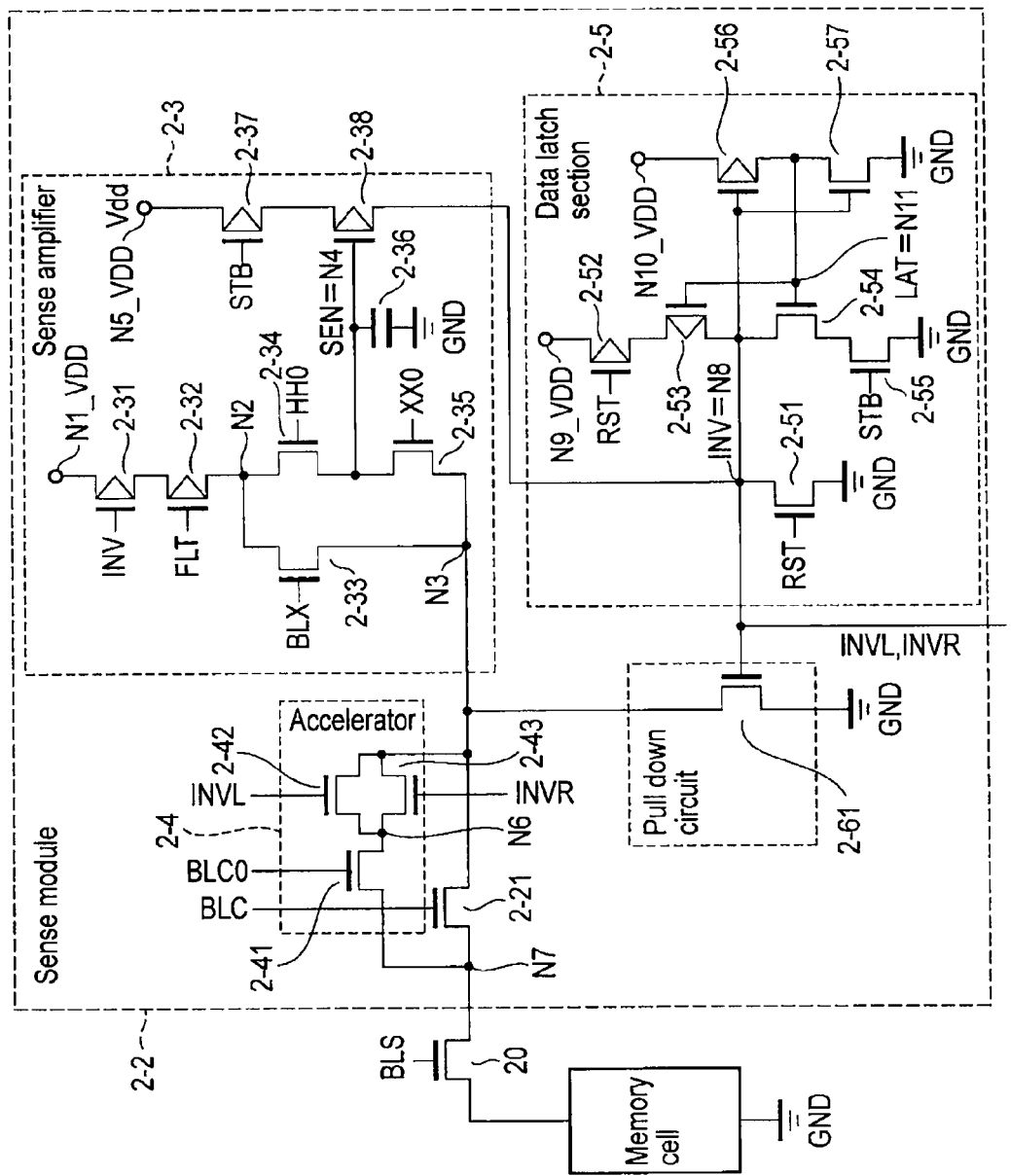
FIG. 4 is a circuit diagram showing a basic configuration of a sense module according to the first embodiment.

Now, a basic configuration of the sense module 2-2 according to the present embodiment will be described with reference to FIG. 4. FIG. 4 is a circuit diagram showing the basic configuration of the sense module 2-2 according to the present embodiment.

As shown in FIG. 4, the sense amplifier 2-3 comprises PMOS transistors 2-31, 2-32, 2-37, and 2-38, NMOS transistors 2-33, 2-34, and 2-35, and a capacitor element 2-36.

One end of a current path in the PMOS transistor 2-31 is connected to a node N1_VDD. The other end of the current path in the PMOS transistor 2-31 is connected to one end of a current path in the PMOS transistor 2-32. A gate of the PMOS transistor 2-31 is provided with a signal INV. The other end of the current path in the PMOS transistor 2-32 is connected to a node N2. A gate of the PMOS transistor 2-32 is provided with a signal FLT. One end of a current path in the NMOS transistor 2-33 is connected to a node N2. The other end of the current path in the NMOS transistor 2-33 is connected to a node N3. A gate of the NMOS transistor 2-33 is provided with a signal BLX. The node N3 is connected to the bit line BL via current paths in the clamping NMOS transistor 2-21 and the bit line select NMOS transistor 20. One end of a current path in the NMOS transistor 2-34 is connected to the node N2. The other end of the current path in the NMOS transistor 2-34 is connected to a node N4 (SEN). A gate of the NMOS transistor 2-34 is provided with a signal HH0. One end of a current path in the NMOS transistor 2-35 is connected to the node N3. The other end of the current path in the NMOS transistor 2-35 is connected to the node N4 (SEN). A gate of the NMOS transistor 2-35 is provided with a signal XX0. The node N4 (SEN) is connected to the node N1_VDD via the PMOS transistors 2-31 and 2-32 and the NMOS transistor 2-34. One electrode of the capacitor element 2-36 is connected to the node N4 (SEN). The other electrode of the capacitor element 2-36 is connected to a ground potential GND. One end of a current path in the PMOS transistor 2-37 is connected to a node N5_VDD. The other end of the current path in the PMOS transistor 2-37 is connected to one end of a current path in the PMOS transistor 2-38. A gate of the PMOS transistor 2-37 is provided with a signal STB. The other end of the current path in the PMOS transistor 2-38 is connected to the data latch section 2-5 via a node N8 (INV). A gate of the PMOS transistor 2-38 is connected to the node N4 (SEN).

The accelerator 2-4 comprises a bit clamping NMOS transistor 2-41, and switch NMOS transistors (also referred to as a switch transistors) 2-42 and 2-43. The switch transistors 2-42 and 2-43 may be collectively referred to as a switch circuit.

One end of a current path in the switch transistor 2-42 is connected to the node N3. The other end of the current path in the switch transistor 2-42 is connected to a node N6. Furthermore, a gate of the switch transistor 2-42 is provided with the signal INVL from the data latch section 2-5 in the sense module 2-2. One end of a current path in the switch transistor 2-43 is connected to the node N3. The other end of the current path in the switch transistor 2-43 is connected to a node N6. Thus, the switch transistors 2-42 and 2-43 are connected together in parallel. A gate of the switch transistor 2-43 is provided with the signal INVR from the data latch section 2-5 in the sense module 2-2.

One end of a current path in the clamp transistor (clamping transistor) 2-41 is connected to the other end of each of the switch transistors 2-42 and 2-43 via the node N6. The other end of the current path in the clamp transistor 2-41 is connected to a node N7. A gate of the clamp transistor 2-41 is provided with a signal BLC0 from the charging control circuit 2-1. The position of the switch transistors 2-42 and 2-43 may be changed to the position of the clamp transistor 2-41.

One end of the current path in the clamp transistor 2-21 is connected to the node N3. The other end of the current path in the clamp transistor 2-21 is connected to the node N1. A gate of the clamp transistor 2-21 is provided with a signal BLC from the charging control circuit 2-1.

One end of the current path in the bit line select transistor 20 is connected to the node N7. The other end of the current path in the bit line select transistor 20 is connected to the bit line. A gate of the bit line select transistor 20 is provided with the signal BLC.

The data latch section 2-5 comprises NMOS transistors 2-51, 2-54, 2-55, and 2-57, and PMOS transistors 2-52, 2-53, and 2-56.

One end of a current path in the NMOS transistor 2-51 is connected to the node N8 (INV). The other end of the current path in the NMOS transistor 2-51 is connected to the ground potential GND. A gate of the NMOS transistor 2-51 is provided with a reset signal RST. One end of a current path in the PMOS transistor 2-52 is connected to a node N9_VDD. The other end of the current path in the PMOS transistor 2-52 is connected to one end of a current path in the PMOS transistor 2-53. A gate of the PMOS transistor 2-52 is provided with the reset signal RST. The other end of the current path in the PMOS transistor 2-53 is connected to the node N8 (INV). A gate of the PMOS transistor 2-53 is provided with LAT.

One end of a current path in the NMOS transistor 2-54 connects to the node N8 (INV). The other end of the current path in the NMOS transistor 2-54 connects to one end of a current path in the NMOS transistor 2-55. A gate of the NMOS transistor 2-54 is provided with LAT. The other end of the current path in the NMOS transistor 2-55 connects to the ground potential GND. A gate of the NMOS transistor 2-55 is provided with STB. One end of a current path in the PMOS transistor 2-56 is connected to a node N11_VDD. The other end of the current path in the PMOS transistor 2-56 is connected to the node LAT. A gate of the PMOS transistor 2-56 is provided with the signal INV. One end of a current path in the NMOS transistor 2-57 is connected to a node LAT. The other end of the current path in the NMOS transistor 2-57 is connected to the ground potential GND. A gate of the NMOS transistor 2-57 is provided with INV. The node N8 supplies INVL to the gate of the switch transistor 2-42 in the adjacent sense module 2-2. The node N8 also supplies INVR to the gate of the switch transistor 2-43 in another adjacent sense module 2-2.

The pull down circuit 2-6 comprises an NMOS transistor 2-61.

One end of a current path in the NMOS transistor 2-61 is connected to the node N3. The other end of the current path in the NMOS transistor 2-61 is connected to the ground potential GND. A gate of the NMOS transistor 2-61 is provided with INV.

<Operation of the Sense Module>

Now, operation of the sense module 2-2 during read will be described. In a read operation, read is simultaneously carried out on a plurality of memory cells by passing current through the memory cells. Since read is simultaneously carried out on the plurality of cells, the sum of cell currents flows through the source line to which all the memory cells are connected. The resistance of the source line serves to increase the potential of the source line when a large cell current flows through the source line. Such an increase in the potential of the source line changes the relationship among the voltages applied to the memory cells. This may lead to misreads. Thus, a plurality of read operations are performed; in the first read, determination is carried out only on cells with large currents, and for memory cells with read completed thereon, the potential of the corresponding bit line is set the same as that of the source line. Then, the second read is carried out. This allows the current flowing through the source line to be reduced when read is carried out on a cell with a small current, which requires a high accuracy. Hence, the read accuracy can be improved.

During data read, the sense amplifier 2-3 senses a current Icell (on) flowing when the memory cell transistor MC is turned on, that is, when the bit line BL and the source line SL are made electrically continuous. The sense amplifier 2-3 thus determines read data to be "1". In contrast, if the memory cell transistor MC is turned off, that is, if the bit line BL and the source line SL are made electrically discontinuous, the sense amplifier 2-3 senses a current Icell (off) to determine the read data to be "0".

During a read operation, the signal BLX is, for example, at an "H (High)" level. The signal XX0 is, for example, at the H level. The signal INV is, for example, at 0 [V] (=VSS) or at a voltage VDD. The signal INV with voltage 0 [V] is assumed to be at an "L (Low)" level. The signal INV with the voltage VDD is assumed to be at the "H" level. That is, the signal INV is either at the "L" level or at the "H" level depending on the potential of the node N8. The signal BLC is controlled by the charging control circuit 2-1. The signal BLC applies a voltage Vb1c that allows the potential of the bit line to be clamped at a predetermined value. Furthermore, the signal HH0 is, for example, at the "H" level or, for example, at the "L" level. Additionally, each of the signal STB and the signal FLT is at 0 [V] or at the voltage VDD. Each of the signals BLX, XX0, and HH0 is provided by the control circuit 7.

Now, a case where "1" read is carried out will be described by way of example.

As shown in FIG. 4, first, before read is carried out on the memory cell MC, the voltage VDD serving as the reset signal RST is provided to the gates of the NMOS transistor 2-51 and the PMOS transistor 2-52. This allows the NMOS transistor 2-51 to be turned on and the PMOS transistor 2-52 to be turned off. Furthermore, the voltage VDD is provided to the gates of the PMOS transistor 2-37 and the NMOS transistor 2-55 to turn off the PMOS transistor 2-37, while turning on the NMOS transistor 2-55. The turn-on of the NMOS transistor 2-51 serves to reduce the potential of the node N8. Thus, the PMOS transistor 2-56 with the node N8 connected to the node thereof is turned on. The NMOS transistor 2-57 with the node N8 connected to the node thereof is turned off. The voltage VDD from the node N10_VDD is fed to the node N11 via the current path in the PMOS transistor 2-56. The potential of the node N11 rises to turn off the PMOS transistor 2-53 with the node N11 connected to the gate thereof. On the other hand, the PMOS transistor 2-54 with the node N11 connected to the gate thereof is turned on. Thus, the node N8 is connected to the ground potential GND (0 V) via the NMOS transistors 2-51, 2-54, and 2-55.

Hence, the potential of the node N8 is set to 0 [V], corresponding to the reset state. In this manner, before the bit line BL is charged, the data latch section is reset. Thereafter, the voltage of the reset signal is reduced (to, for example, 0 V) so as to prevent the NMOS transistor 2-51 from being turned on.

Subsequently, the bit line BL is precharged. Since the potential of the node N8 is at 0 [V], the gate of the PMOS transistor 2-31 is provided with the "L" level serving as the signal INV. The gate of the PMOS transistor 2-32 is provided with 0 [V]. The gate of the NMOS transistor 2-33 is provided with an "H" level signal. Furthermore, the gate of the clamp transistor 2-21 is provided with an "H" level signal. Thus, the PMOS transistors 2-31 and 2-32 and the NMOS transistors 2-33 and 2-34 are each turned on. Additionally, the gate of the bit line select transistor 20 is provided with such a voltage as turns on the transistor 20. The transistor 20 is thus turned on.

The memory cell is electrically continuous. Thus, a current flows through the bit line via the current paths in the PMOS transistors 2-31 and 2-32, the node N2, the NMOS transistor 2-33, the node N3, the clamp transistor 2-21, the node N7, and the bit line select transistor 20.

That is, a current flows from the bit line BL to the source line SL, with the potential of the bit line BL fixed at a predetermined value. Furthermore, an "H" level signal is provided to the gate of the NMOS transistor 2-34 to turn on the NMOS transistor 2-34. Thus, the capacitive element 2-36 is charged to set the potential of the node N4 to about VDD [V]. The PMOS transistor 2-37 is in the off state.

Then, the node N4 is discharged. That is, the NMOS transistor 2-34 is turned off. Then, a current flowing from the node N4 to the bit line BL allows the node N4 to be discharged. When a predetermined time elapses, the NMOS transistor 2-35 is turned off to end the discharge of the node N4. After the discharge ends, the potential of the node N4 decreases to a value dependent on the current flowing through the bit line. A reference current Iref lies between a current in the memory cell which allows the memory cell to be determined to be on and a current in the memory cell which allows the memory cell to be determined to be off. The reference current Iref allows determination of whether the memory cell is on or off. A reference potential Vref refers to the potential of the node N4 obtained when the node N4 is discharged by the reference current Iref. Then, if the memory cell is on (Icell>Iref), the potential of the node N4 is equal to or lower than the reference potential Vref. If the memory cell is off (Icell<Iref), the potential of the node N4 is equal to or higher than the reference voltage Vref. The reference potential Vref is set such that the difference between VDD and Vref is equal to (the absolute value of) a threshold Vtp for the PMOS transistor 2-38 (VDD−Vref=|Vtp|).

Then, the data in the memory cell MC is sensed (read). Zero [V] serving as the signal STB is provided to the gate of the PMOS transistor 2-37 to turn on the PMOS transistor 2-37. Furthermore, if the cell current Icell>Iref, the potential of the node N4 becomes lower than the reference voltage Vref. Thus, the PMOS transistor 2-38 is turned on. Hence, the voltage VDD is fed from the node N5_VDD to the node N8 via the PMOS transistors 2-37 and 2-38. The voltage VDD is provided to the gate of the PMOS transistor 2-56 to turn off the transistor 2-56. The voltage VDD is provided to the gate of the NMOS transistor 2-57 to turn on the transistor 2-57. Thus, the node N11 is connected to the ground potential (0 V) via the NMOS transistor 2-57. The 0 [V] provided to the gate of the PMOS transistor 2-52 allows the transistor 2-52 to be turned on. The 0 [V] provided to the gate of the PMOS transistor 2-53 allows the transistor 2-53 to be turned on. Furthermore, the 0 [V] provided to the gate of the NMOS transistor 2-54 allows the transistor 2-54 to be turned off. Additionally, the 0 [V] supplied to the gate of the NMOS transistor 2-51 allows the transistor 2-51 to be turned off.

Thus, the data latch section 2-5 maintains the voltage VDD. That is, the data latch section 2-5 continuously holds "1" data.

The voltage VDD is provided to the gate of the NMOS transistor 2-61 to turn on the transistor 2-61. This reduces the potential of the bit line BL to the ground potential.

Furthermore, the voltage VDD serving as INVL is supplied to the accelerator 2-4 of the adjacent sense module 2-2 via the node N8. The voltage VDD serving as INVR is supplied to the accelerator 2-4 of another adjacent sense module 2-2.

As described above, the data read operation is performed by the sense amplifier 2-4 by sensing the potential of the node N4 after the node N4 is discharged by the current in the memory cell. In other words, the data read operation is performed by sensing the current flowing through the bit line BL.

The value of the reference voltage Vref can be changed based on the value of the capacitance 2-36 or the time from the turn-off NMOS transistor 2-34 until the NMOS transistor 2-35 is turned off.

If the data latch section 2-5 holds the "1" data, the node N8 is at the "H" level. Thus, the "H" level voltage is provided to the gate of the MOS transistor 2-61 to turn on the MOS transistor 2-61. Hence, the bit line BL is connected to the ground potential via the current path in the transistor 2-61. Furthermore, if the data latch section 2-5 holds "0" data, the node N8 is at the "L" level. Thus, the "L" level voltage is provided to the gate of the MOS transistor 2-61 to turn off the MOS transistor 2-61. Hence, the bit line BL avoids being connected to the ground potential.

<Charging Operation of the Sense Module>

Now, with reference to FIG. 4, FIG. 5, and FIG. 6, an operation will be described which is performed by a sense module connected to a bit line adjacent to a bit line BL with the potential thereof having decreased to the ground potential during the read operation. FIG. 5 is a circuit diagram schematically showing sense modules and bit lines according to the present embodiment. FIG. 6 is a timing chart illustrating a charging operation of a semiconductor device according to the present embodiment.

As shown in FIG. 5, the bit lines BL0 and BL1 are adjacent to each other. The bit lines BL1 and BL2 are adjacent to each other. The bit lines BL2 and BL3 are not adjacent to each other. A current Isa0 is supplied to the bit line BL0 by the sense module 2-2. A current Isa1 is supplied to the bit line BL1 by the sense module 2-2. A current Isa2 is supplied to the bit line BL2 by the sense module 2-2. A current Isa3 is supplied to the bit line BL3 by the sense module 2-2.

As shown in FIG. 5 and FIG. 6, during a read operation, when the potential of a bit line to which a memory cell with read completed thereon belongs is set equal to the ground potential, an inter-bit-line BL parasitic capacitance acts to reduce the potential of an adjacent bit line BL (with read not completed thereon yet). The reduced potential of the bit line results in the need to charge the potential of the bit line to a desired value.

Thus, at a point of time t1, the following takes place.

(1) The charging control circuit 2-1 makes the potential of BLC0 equivalent to, for example, that of BLC. Thus, the clamp transistor 2-41 of each sense module 2-2 is turned on.

(2) Read is completed on the bit lines BL0 and BL2. The node N8 (INV) in each sense module 2-2 is set to the "H" level. Thus, the pull down circuit in each sense module 2-2 reduces the potential of each of the bit lines BL0 and BL2 from VBL to the ground potential.

(3) The inter-bit-line BL parasitic capacitance acts to reduce the potential of the bit line BL1 of interest from VBL to a predetermined value.

(4) As shown in the accelerator 2-4 in FIG. 4, read is completed on the bit line BL0, located adjacent to the bit line BL1 of interest. INV of the sense module 2-2 belonging to the bit line BL0 is set to the "H" level. Thus, the "H" level serving as INVL is provided to the gate of the switch transistor 2-42 of the sense module 2-2 belonging to the bit line BL1 of interest. Thus, the switch transistor 2-42 is turned on. Furthermore, read is completed on the bit line BL2, located adjacent to the bit line BL1 of interest. INV of the sense module 2-2 belonging to the bit line BL2 is set to the "H" level. Thus, the "H" level serving as INVR is provided to the gate of the switch transistor 2-43 of the sense module 2-2 belonging to the bit line BL1 of interest. Thus, the switch transistor 2-43 is turned on. Hence, the bit line BL1 of interest is charged not only via the current path in the clamp transistor 2-21 as in the conventional art but also via the current paths in the node N3, the switch transistors 2-42/2-43, the clamp transistor 2-41, the node N7, and the bit line select transistor 20. This enables the potential of the bit line BL of interest to be recovered to the desired value earlier than in the use of only the current path in the clamp transistor 2-21 (see the corresponding dashed lines in FIG. 6). Furthermore, the gate of the second clamp transistor 2-41 is provided with a potential equivalent to that provided to the gate of the first clamp transistor 2-21. Thus, the accelerator 2-4 can output a voltage equivalent to that applied to the other end of the current path in the first clamp transistor 2-21.

(5) The bit line BL adjacent to the bit line BL3 is not set to the ground potential. Thus, the bit line BL3 is prevented from being affected by the inter-bit-line BL parasitic capacitance, avoiding a decrease in the potential of the bit line BL. This eliminates the need to charge the bit line BL. Furthermore, the bit line BL3 is overcharged if charged similarly to the bit line BL1. In this case, a time required to discharge the bit line BL3 by an amount corresponding to the overcharging is added to the bit line recovery time. Thus, overcharging the bit line BL3 extends the recovery time. Hence, the switch transistors 2-42 and 2-43, provided in the accelerator 2-4, remain off if the potential of the adjacent bit line BL does not decrease. This allows the bit line BL3 to be restrained from being overcharged (see the corresponding dashed line in FIG. 6).

At a point of time t2, the accelerator 2-4 recovers the potential of the bit line BL1 to the desired value. This reduces the potential of the signal BLC0 to end the charging of the bit line BL1.

In the above-described example, read is completed on the bit lines BL0 and BL2. However, with the accelerator 2-4 configured as shown in FIG. 4, even when read is completed on only at least one of the bit lines BL0 and BL2, both of which are adjacent to the bit line BL1 of interest, a similar charging operation can be achieved.

<Effects of the Sense Module>

According to the above-described embodiment, the nonvolatile semiconductor storage device 100 comprises the electrically rewritable memory cells MC, the word lines WL each connected to the gate of the corresponding memory cell MC, and the bit lines BL each connected to one end of the current path in the corresponding memory cell MC. Furthermore, the nonvolatile semiconductor storage device 100 comprises the first clamp transistors 2-21 each with the current path connected to the corresponding bit line BL at one end thereof, the second clamp transistors 2-41 electrically connected together, and the switch circuits (first switch transistor 2-42 and second switch transistor 2-43). The nonvolatile semiconductor storage device 100 further comprises the accelerators (voltage controllers) 2-4 each connected to the corresponding bit line BL and the sense amplifiers 2-3 each connected to the other end of the current path in the corresponding first clamp transistor 2-21 and to the corresponding voltage controller 2-4. Moreover, the nonvolatile semiconductor storage device 100 comprises the data latch sections 2-5 each electrically connected to the corresponding sense amplifier 2-3 to hold the first data ("L" level) before read is carried out on the corresponding memory cell MC and to hold the second data ("H" level) if a predetermined or larger current flows through the corresponding bit line; the pull down circuits 2-6 each with the current path connected, at one end thereof, to the other end of the current path in the first clamp transistor 2-21 and with the gate thereof connected to the corresponding data latch section 2-5, to reduce the potential of the corresponding bit line BL to the reset potential (for example, the ground potential or the "L" level) if the first data is saved to the data latch section 2-5; and the charging control circuits 2-1 each configured to apply the predetermined potentials to the gates of the corresponding first clamp transistor 2-21 and second clamp transistor 2-41. Then, the gate of the switch transistor 2-42 or 2-43 is provided with the signal INVL or INVR from another data latch section 2-5 located adjacently in the direction of the word lines W. The switch transistor 2-42 or 2-43 is thus turned on or off depending on the data held in the other data latch section 2-5 located adjacently in the direction of the word lines W. This allows the connection between the bit line BL and the sense amplifier 2-3 via the voltage controller 2-4 to be controlled.

Furthermore, if the data is saved to at least one, another data latch section 2-5 located adjacently in the direction of the word lines WL, the first data is provided to the gate of the switch transistor 2-42 or 2-43, which is thus turned on.

When read is carried out in the nonvolatile semiconductor storage device, the potential of the bit line BL subjected to the read may be reduced to the ground potential. Then, the inter-bit-line BL capacitive coupling acts to reduce the potential of the adjacent bit line with read not completed thereon yet. When the potentials of the bit lines decrease as described above, the bit lines BL need to be charged again to the desired potentials. For the bit line BL for which read has not completed on the adjacent bit line BL yet (the adjacent bit line BL has not been reduced in potential), accelerated charging need not be carried out because the bit line BL has not been reduced in potential.

The configuration and operation described above in the embodiment enable improvement of the capability of charging the bit line BL only for the bit lines BL which are located adjacent to the bit line BL with read completed thereon and the potential thereof reduced and which require a long time for charging.

Specifically, in each of the adjacent sense modules 2-2, the node N8 (INV) in the data latch section 2-5, in which the read data is held, is connected to the gate of the switch transistor 2-42 or 2-43 in the accelerator 2-4 of the other, adjacent sense module 2-2. Furthermore, the node N8 in the data latch section 2-5 is connected to the gate of the NMOS transistor 2-61, which reduces the potential of the bit line BL to the ground potential.

That is, when the node N8 in the data latch section 2-5 is set to the "H" level, the transistor 2-61 is turned on to reduce the potential of the bit line BL to the ground potential. However, since the node N8 is connected to the accelerator 2-4 in another adjacent sense module 2-2, the bit line BL adjacent to the bit line BL with the potential thereof reduced to the ground potential can be charged in an accelerated manner. Furthermore, if the potential of the adjacent bit line BL is not reduced to the ground potential, the accelerator 2-4 is prevented from being turned on. As a result, accelerated charging is avoided.

Thus, according to the above-described embodiment, during a read operation, the bit line BL can be charged at a high speed even if the adjacent bit line BL is reduced in potential as a result of the end of a read. Furthermore, at the same time, the bit line BL for which the adjacent bit line BL is not reduced in potential can be restrained from being overcharged. As a result, a semiconductor storage device can be provided which allows the bit line to be charged at a high speed to enable read characteristics to be improved.

Second Embodiment

Figure 7:
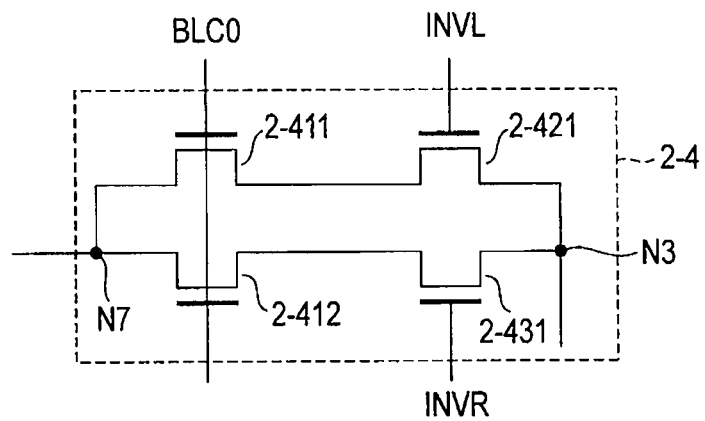
FIG. 7 is a circuit diagram schematically showing a configuration of an accelerator according to a second embodiment.

Now, a configuration of an accelerator (voltage controller) 2-4 according to a second embodiment will be described with reference to FIG. 7. FIG. 7 is a circuit diagram schematically showing the configuration of the accelerator according to the second embodiment. The basic configuration and operation of the accelerator are similar to those described above in the first embodiment. Thus, the matters described above in the first embodiment and matters that can be easily envisaged from the above-described embodiment will not be described.
<Configuration of the Accelerator>

As shown in FIG. 7, the accelerator 2-4 comprises bit line clamping NMOS transistors 2-411 and 2-412 and switch NMOS transistors 2-421 and 2-431.

One end of a current path in the switch transistor 2-421 is connected to a node N3. The other end of the current path in the switch transistor 2-421 is connected to one end of a current path in the clamp transistor 2-411. Furthermore, a gate of the switch transistor 2-421 is provided with a signal INVL from a data latch section 2-5 of an adjacent sense module 2-2.

The one end of the current path in the clamp transistor 2-411 is connected to the other end of the current path in the switch transistor 2-421. The other end of the current path in the clamp transistor 2-411 is connected to a node N7. A gate of the clamp transistor 2-411 is provided with a signal BLC0 from a charging control circuit 2-1.

One end of a current path in the switch transistor 2-431 is connected to the node N3. The other end of the current path in the switch transistor 2-431 is connected to one end of the current path in the clamp transistor 2-411. Furthermore, a gate of the switch transistor 2-431 is provided with a signal INVR from the data latch section 2-5 of another adjacent sense module 2-2.

One end of a current path in the clamp transistor 2-412 is connected to the other end of the current path in the switch transistor 2-431. The other end of the current path in the clamp transistor 2-412 is connected to the node N7. A gate of the clamp transistor 2-412 is provided with the signal BLC0 from the charging control circuit 2-1.

Thus, the switch transistor 2-421 and the clamp transistor 2-411 are connected in parallel with the switch transistor 2-431 and the clamp transistor 2-412.

The position of the switch transistor 2-421 and the clamp transistor 2-411 may be changed to the position of the switch transistor 2-431 and the clamp transistor 2-412.
<Operation of the Accelerator>

Now, a charging operation of the accelerator according to the second embodiment during read will be described in brief.

When read is completed on a bit line BL adjacent to a bit line BL of interest, INV of the sense module 2-2 belonging to the adjacent bit line BL is set to the "H" level. Thus, the "H" level serving as INVL is provided to the gate of the switch transistor 2-421 in the sense module 2-2 belonging to the bit line BL of interest. Hence, the switch transistor 2-421 is turned on.

Thus, the bit line BL of interest can be charged not only via the current path in the clamp transistor 2-21 as in the conventional art but also via the current paths in the node N3, the switch transistor 2-421, the clamp transistor 2-411, the node N7, and the bit line select transistor 20.

Furthermore, when read is completed on another bit line BL adjacent to the bit line BL of interest, INV of the sense module 2-2 belonging to the other adjacent bit line BL is set to the "H" level. Thus, the "H" level serving as INVR is provided to the gate of the switch transistor 2-431 in the sense module belonging to the bit line BL of interest. Thus, the switch transistor 2-431 is turned on.

Thus, the bit line BL of interest can be charged not only via the current path in the clamp transistor 2-21 as in the conventional art but also via the current paths in the node N3, the switch transistor 2-431, the clamp transistor 2-412, the node N7, and the bit line select transistor 20.

Effects of the Second Embodiment

According to the above-described second embodiment, the accelerator (voltage controller) 2-4 comprises the third clamp transistor 2-412 with the current path connected, at one end thereof, to one end of the current path in the second clamp transistor 2-411 and with the gate thereof provided with BLC0; the third clamp transistor 2-412 is connected to the second clamp transistor 2-411. Furthermore, the switch circuit comprises the first switch transistor 2-421 with the current path connected, at one end thereof, to the other end of the current path in the second clamp transistor 2-411, and the second switch transistor 2-431 with the current path connected, at one end thereof, to the other end of the third clamp transistor 2-412 and at the other end thereof, to the other end of the first clamp transistor 2-421. In the switch circuit, if the first data is not saved to another data latch section 2-5 or yet another data latch section 2-5 located adjacently in the direction of the word lines WL, the first switch transistor 2-421 and the second switch transistor 2-431 are turned off. If the first data is saved to the other data latch section 2-5 located adjacently in the direction of the word lines WL, the first switch transistor 2-421 is turned on. If the first data is saved to the other data latch section 2-5 located adjacently in the direction of the word lines WL, the second switch transistor 2-431 is turned on.

As described above, the accelerator 2-4 comprises the charging path including the switch transistor 2-421 and the clamp transistor 2-411 and the charging path including the switch transistor 2-431 and the clamp transistor 2-412. If read is completed on the bit lines (adjacent bit lines) on the respective opposite sides of the bit line to be charged, the bit line to be charged is seriously affected by the adjacent bit lines. The bit line to be charged requires more charging. Furthermore, if read is completed only on the bit line on one side of the bit line to be charged, the bit line to be charged is insignificantly affected. Thus, accelerated charging of the bit line to be charged may be suppressed compared to that carried out if read is completed on the bit lines (adjacent bit lines) on the respective opposite sides of the bit line to be charged. The accelerator 2-4 in the second embodiment involves more charging paths than that described in the first embodiment. Thus, if read is completed on the bit line adjacent to the bit line BL of interest and another adjacent bit line (the bit lines on the respective opposite sides), the potential of the bit line BL of interest can be recovered to the desired value more quickly than in the first embodiment. Furthermore, if read is completed only on the bit line on one side of the bit line to be charged, the bit line BL of interest can be appropriately charged with the charging capability limited and with unwanted overcharging avoided.

Third Embodiment

Figure 8:
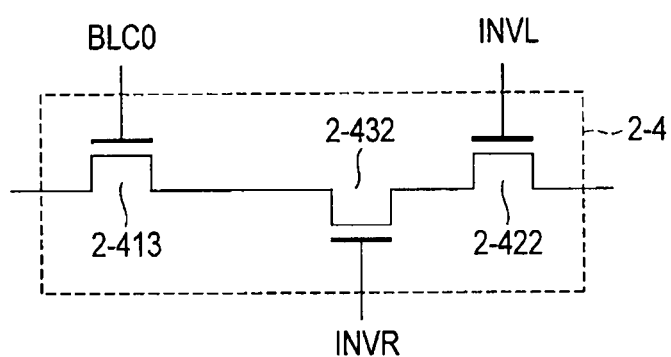
FIG. 8 is a circuit diagram schematically showing a configuration of an accelerator according to a third embodiment.

Now, a configuration of an accelerator (voltage controller) 2-4 according to a third embodiment will be described with reference to FIG. 8. FIG. 8 is a circuit diagram schematically showing the configuration of the accelerator according to the third embodiment. The basic configuration and operation of the accelerator are similar to those described above in the first embodiment. Thus, the matters described above in the first embodiment and matters that can be easily envisaged from the above-described embodiment will not be described.

<Configuration of the Accelerator>

As shown in FIG. 8, the accelerator 2-4 comprises a bit line clamping NMOS transistors 2-413, and switch NMOS transistors 2-422 and 2-432.

One end of a current path in the switch transistor 2-422 is connected to a node N3. The other end of the current path in the switch transistor 2-422 is connected to one end of the switch transistor 2-432. Furthermore, a gate of the switch transistor 2-422 is provided with a signal INVL from a data latch section 2-5 of an adjacent sense module 2-2.

The one end of the current path in the switch transistor 2-432 is connected to the other end of the switch transistor 2-422. The other end of the current path in the switch transistor 2-432 is connected to one end of a current path in the clamp transistor 2-413. Furthermore, a gate of the switch transistor 2-432 is provided with a signal INVR from a data latch section 2-5 in another adjacent sense module 2-2.

The one end of the current path in the clamp transistor 2-413 is connected to the other end of the current path in the switch transistor 2-432. The other end of the current path in the clamp transistor 2-413 is connected to a node N7. A gate of the clamp transistor 2-413 is provided with a signal BLC0 from a charging control circuit 2-1.

Thus, the switch transistor 2-422, the switch transistor 2-432, and the clamp transistor 2-413 are connected together in series.

The position of the switch transistors 2-422 and 2-432 may be changed to the position of the clamp transistor 2-413.

<Operation of the Accelerator>

Now, a charging operation of the accelerator according to the third embodiment during read will be described in brief.

When read is completed on a bit line BL adjacent to a bit line BL of interest, INV of the sense module 2-2 belonging to the adjacent bit line BL is set to the "H" level. Thus, the "H" level serving as INVL is provided to the gate of the switch transistor 2-422 in the sense module 2-2 belonging to the bit line BL of interest. Hence, the switch transistor 2-422 is turned on.

Furthermore, when read is completed on another bit line BL adjacent to the bit line BL of interest, INV of the sense module 2-2 belonging to the other adjacent bit line BL is set to the "H" level. Thus, the "H" level serving as INVR is provided to the gate of the switch transistor 2-432 in the sense module belonging to the bit line BL of interest. Thus, the switch transistor 2-432 is turned on.

Thus, the bit line BL of interest can be charged not only via the current path in the clamp transistor 2-21 as in the conventional art but also via the current paths in the node N3, the switch transistor 2-422, the switch transistor 2-432, the clamp transistor 2-413, the node N7, and the bit line select transistor 20.

Effects of the Second Embodiment

According to the above-described third embodiment, if first data is saved to two other data latch sections 2-5 located adjacently in the direction of the word lines WL, the switch circuit is turned on.

Thus, in the accelerator 2-4, the switch transistors 2-422 and 2-432 are connected together in series. Hence, the bit line BL of interest is charged in an accelerated manner only if read is completed on the adjacent bit line and another adjacent bit line (the bit lines on the respective opposite sides of the bit line BL of interest). If read is completed only on the bit line on one side of the bit line BL of interest, accelerated charging of the bit line BL of interest is avoided. This is effective if each of the adjacent bit lines BL on the respective opposite sides of the bit line BL of interest involves only a small inter-bit-line BL parasitic capacitance and if accelerated charging in this case may lead to overcharging.

Fourth Embodiment

Figure 9:
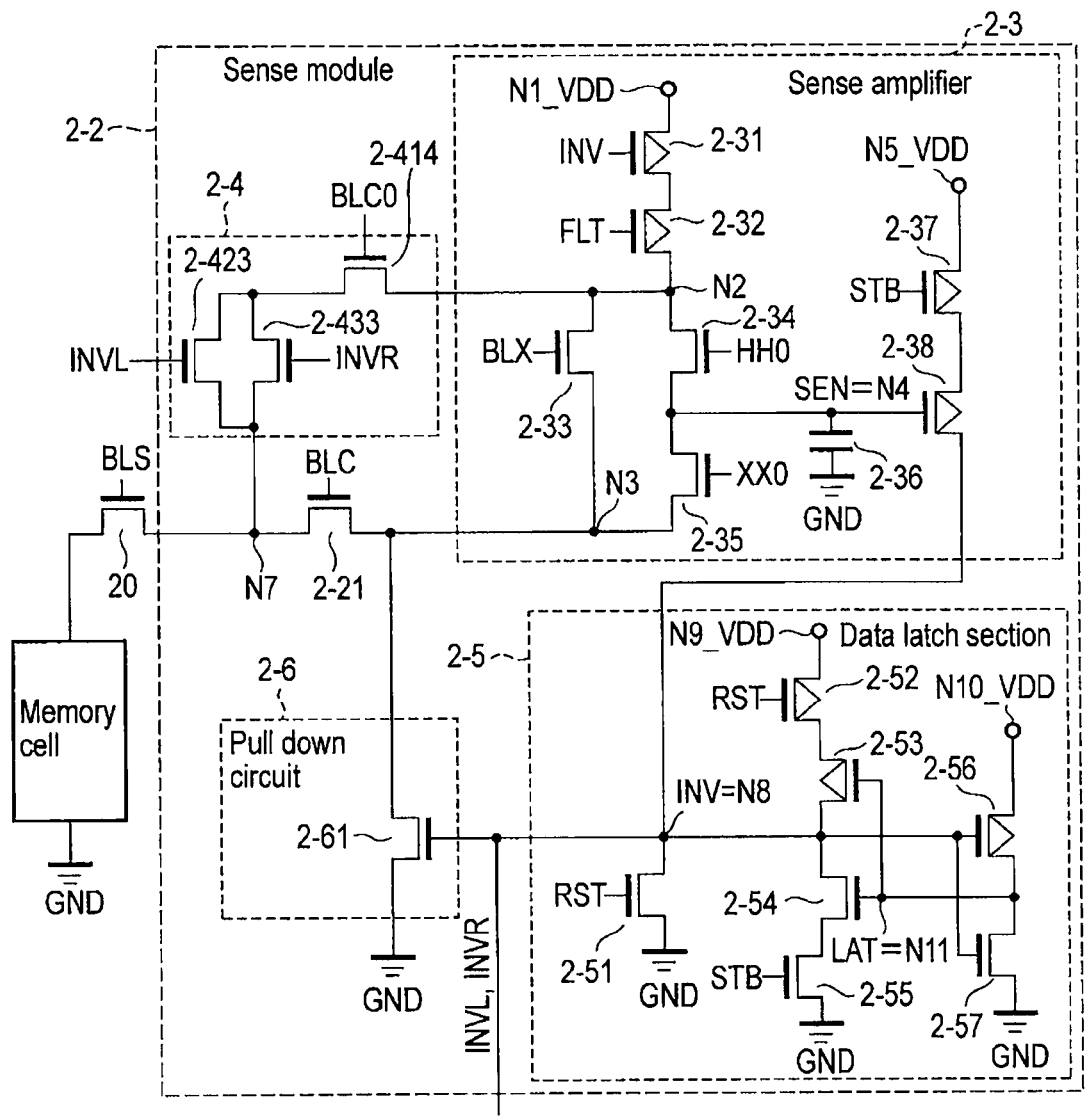
FIG. 9 is a circuit diagram schematically showing a configuration of an accelerator according to a fourth embodiment.

Now, a configuration of an accelerator (voltage controller) 2-4 according to a fourth embodiment will be described with reference to FIG. 9. FIG. 9 is a circuit diagram schematically showing the configuration of the accelerator according to the fourth embodiment. The basic configuration and operation of the accelerator are similar to those described above in the first embodiment. Thus, the matters described above in the first embodiment and matters that can be easily envisaged from the above-described embodiment will not be described.

<Configuration of the Accelerator>

As shown in FIG. 9, the accelerator 2-4 comprises a bit line clamping NMOS transistors 2-414, and switch NMOS transistors 2-423 and 2-433.

One end of a current path in the clamp transistor 2-414 is connected to a node N2. The other end of the current path in the clamp transistor 2-414 is connected to a node N12. A gate of the clamp transistor 2-414 is provided with a signal BLC0 from a charging control circuit 2-1.

One end of a current path in the switch transistor 2-423 is connected to the node N12. The other end of the current path in the switch transistor 2-423 is connected to a node N7. Furthermore, a gate of the switch transistor 2-423 is provided with a signal INVL from a data latch section 2-5 of an adjacent sense module 2-2.

One end of a current path in the switch transistor 2-433 is connected to the node N12. The other end of the current path in the switch transistor 2-433 is connected to the node N7. Furthermore, a gate of the switch transistor 2-433 is provided with a signal INVR from a data latch section 2-5 of another adjacent sense module 2-2.

<Operation of the Accelerator>

Now, a charging operation of the accelerator according to the fourth embodiment during read will be described in brief.

The switch transistor 2-423 operates similarly to the switch transistor 2-42 described in the first embodiment. The switch transistor 2-433 operates similarly to the switch transistor 2-43 described in the first embodiment. Furthermore, the switch transistor 2-414 operates similarly to the switch transistor 2-41 described in the first embodiment.

Thus, a bit line BL of interest can be charged not only via the current path in the clamp transistor 2-21 as in the conventional art but also via the current paths in the node N2, the clamp transistor 2-414, the switch transistor 2-423, the switch transistor 2-433, the node N7, and the bit line select transistor 20.

Effects of the Fourth Embodiment

According to the above-described fourth embodiment, one end of the accelerator 2-4 is connected to the node provided with a power supply voltage VDD. The other end of the accelerator 2-4 is connected to the node N7. When the one end of the accelerator 2-4 is thus connected to the node N2, the drain-source potential of the NMOS transistor 2-414 is higher than in the accelerator in each of the above-described embodiments. Hence, a larger current can be supplied to the bit line BL.

Fifth Embodiment

Figure 10:
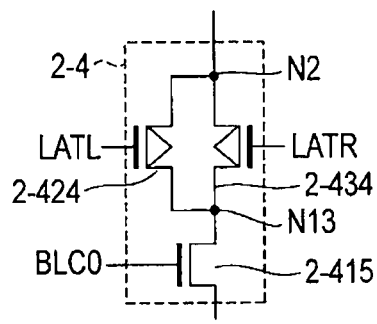
FIG. 10 is a circuit diagram schematically showing a configuration of an accelerator according to a fifth embodiment.

Now, a configuration of an accelerator (voltage controller) 2-4 according to a fifth embodiment will be described with reference to FIG. 10. FIG. 10 is a circuit diagram schematically showing the configuration of the accelerator according to the fifth embodiment. The basic configuration and operation of the accelerator are similar to those described above in the first embodiment. Thus, the matters described above in the first embodiment and matters that can be easily envisaged from the above-described embodiment will not be described.

<Configuration of the Accelerator>

As shown in FIG. 10, the accelerator 2-4 comprises a bit line clamping NMOS transistors 2-415, and switch PMOS transistors (also referred to as switch transistors) 2-424 and 2-434.

One end of a current path in the switch transistor 2-424 is connected to a node N2. The other end of the current path in the switch transistor 2-424 is connected to a node N13. Furthermore, a gate of the switch transistor 2-424 is connected to a node N11 in a data latch section 2-5 of an adjacent sense module 2-2 and provided with a signal LATL.

One end of a current path in the switch transistor 2-434 is connected to the node N2. The other end of the current path in the switch transistor 2-434 is connected to the node N13. Furthermore, a gate of the switch transistor 2-434 is connected to the node N11 in the data latch section 2-5 of the adjacent sense module 2-2 and provided with a signal LATR.

One end of a current path in the clamp transistor 2-415 is connected to the node N13. The other end of the current path in the clamp transistor 2-415 is connected to a node N7. A gate of the clamp transistor 2-415 is provided with a signal BLC0 from a charging control circuit 2-1.

<Operation of the Accelerator>

Now, a charging operation of the accelerator according to the fifth embodiment during read will be described in brief.

The switch transistor 2-424 corresponds to the switch transistor 2-423 described in the fourth embodiment and changed from the N type to the P type, with the gate of the switch transistor 423 provided with LAT (node N11). Furthermore, the switch transistor 2-434 corresponds to the switch transistor 2-433 described in the fourth embodiment and changed from the N type to the P type, with the gate of the switch transistor 433 provided with LAT (node N11). Here, as described in the fourth embodiment, the accelerator involves the following relationship. If INV (node N8) is at the "H" level, LAT (node N11) is at the "L" level. If INV (node N8) is at the "L" level, LAT (node N11) is at the "H" level. Thus, the switch transistor 2-424, including the gate provided with LAT instead of INV, operates similarly to the switch transistor 2-423. The switch transistor 2-434 operates similarly to the switch transistor 2-433.

Thus, a bit line BL of interest can be charged not only via the current path in the clamp transistor 2-21 as in the conventional art but also via the current paths in the node N2, the switch transistors 2-424/2-434, the node N13, the clamp transistor 2-415, the node N7, and the bit line select transistor 20.

Effects of the Fifth Embodiment

According to the above-described fifth embodiment, one end of the accelerator 2-4 is connected to the node provided with a power supply voltage VDD. The other end of the accelerator 2-4 is connected to the node N7. Furthermore, since PMOS transistors are used as the switch transistors 2-424 and 2-434, the voltage VDD can be set for the switch transistors more easily than for NMOS transistors. When the one end of the accelerator 2-4 is thus connected to the node N2, the drain-source potential of the NMOS transistor 2-414 is higher than in the accelerator in each of the above-described embodiments. Hence, a larger current can be supplied to the bit line BL.

Sixth Embodiment

Figure 11:
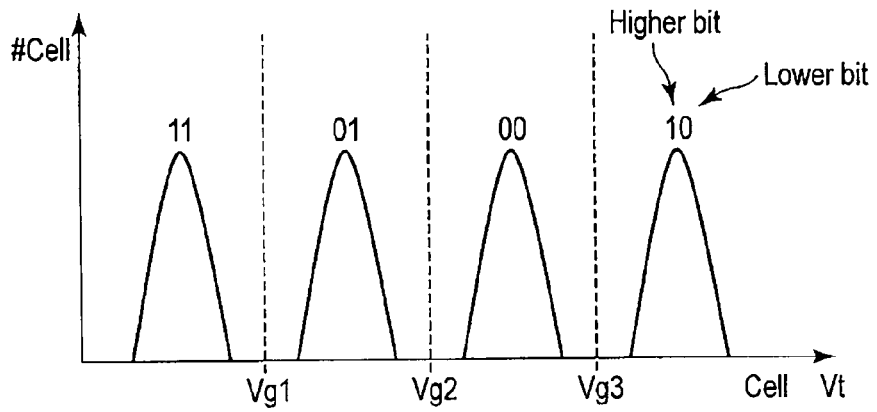
FIG. 11 is a threshold distribution diagram of a memory cell according to a sixth embodiment.
Figure 12A:
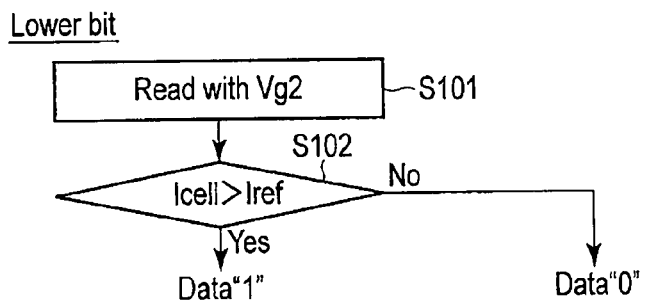
FIG. 12A is a flowchart illustrating a read operation performed on a lower bit in a semiconductor device according to a seventh embodiment.
Figure 12B:
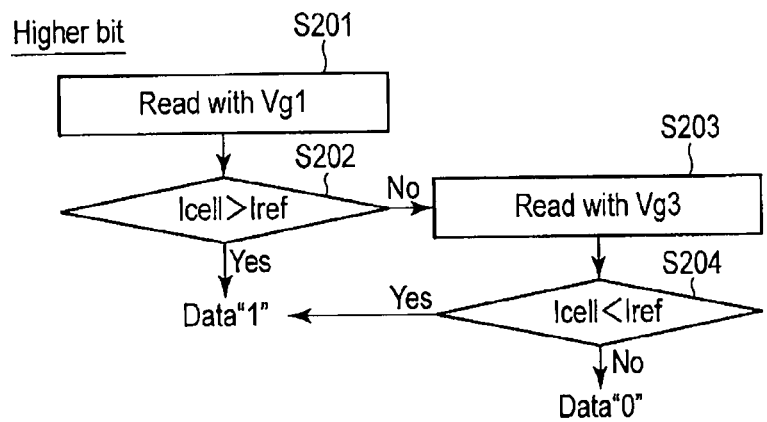
FIG. 12B is a flowchart illustrating a read operation performed on a higher bit in the semiconductor device according to the seventh embodiment.

Now, a configuration of an accelerator (voltage controller) 2-4 according to a sixth embodiment will be described with reference to FIG. 11, FIG. 12A, and FIG. 12B. FIG. 11 is a threshold distribution diagram of a memory cell according to the sixth embodiment. FIG. 12A is a flowchart illustrating a read operation performed on a lower bit in a semiconductor device according to the sixth embodiment. FIG. 12B is a flowchart illustrating a read operation performed on a higher bit in the semiconductor device according to the sixth embodiment. The basic configuration and operation of the accelerator are similar to those described above in the first embodiment. Thus, the matters described above in the first embodiment and matters that can be easily envisaged from the above-described embodiment will not be described.

In multi-valued memory cells each of which is configured to store least 2 bits of data, at least two reads with different read levels are carried out to identify the read data. Here, a memory cell configured to store 4-level data will be described.

As shown in FIG. 11, the memory cell has four threshold distributions corresponding to four levels. Each level has an address of 2 bits, a higher bit and a lower bit. Here, the addresses are numbered in order of increasing threshold value, that is, 11, 01, 00, 10. The left number corresponds to the higher bit. The right number corresponds to the lower bit. Read voltage levels used to determine the level of the data are denoted by Vg1, Vg2, and Vg3, respectively. The voltage levels correspond to voltages applied to a word line WL during a read operation.

When any of the read voltage levels is applied to the word line WL, if a cell current Icell flowing through the cell is larger than a reference current Iref, the data is determined to be Data "1". If the cell current Icell is smaller than the reference current Iref, the data is determined to be Data "0". A read operation on the multi-valued memory cell is performed as illustrated in FIG. 12.

<Carrying Out Read on the Lower Bit (See FIG. 12A)>

(Step S101)

When, as a read level, Vg2 is set for the word line WL, read can be carried out on the lower bit.

(Step S102)

When the voltage level of the word line WL is set to Vg2, if the current Icell flowing through the memory cell is larger than the reference voltage Iref (Icell>Iref), the lower bit is determined to be "1". Furthermore, if the current Icell flowing through the memory cell is not larger than the reference voltage Iref (Icell<Iref), the lower bit is determined to be "0". In this manner, the data in the lower bit can be identified.

<Carrying Out Read on the Higher Bit (See FIG. 12B)>

To identify the data in the higher bit, read is carried out using two levels, Vg1 and Vg3. Then, based on the results, whether the data is "0" or "1" is determined.

(Step S201)

First, read is carried out on the higher bit with Vg1 set for the word line WL as a read level.

(Step S202)

At this time, if the cell current Icell is larger than the reference voltage Iref (Icell>Iref), the higher bit is determined to be "1". Furthermore, if the cell current Icell is not larger than the reference voltage Iref (Icell<Iref), the process proceeds to step S203.

(Step S203)

Then, read is carried out again with Vg3 set for the word line WL as a read level.

(Step S204)

At this time, if the cell current Icell is smaller than the reference voltage Iref (Icell<Iref), the higher bit is determined to be "1". Furthermore, if the cell current Icell is not smaller than the reference voltage Iref (Icell>Iref), the higher bit is determined to be "0". Then, the read ends. This determination can be carried out by an external circuit by removing data from the sense amplifier.

As described above, in a nonvolatile semiconductor storage device in which read is simultaneously carried out on a plurality of memory cells, a plurality of read operations are performed when the higher bit is subjected to read. However, on a cell with the higher data (or the lower data) determined to be "1" during the first read, the second read need not be carried out. Thus, during the second read, the same potential as that of the source line is applied to a bit line BL with such a memory cell connected thereto (the cell current flowing through the source line is reduced to suppress a rise in the voltage of the source line).

As in the case of the first embodiment, during the first and second reads, a bit line BL for a memory cell with read completed thereon is set to the ground potential. Thus, as is the case with the example described in the first embodiment, if the potential of a bit line BL adjacent to a bit line BL for the second read decreases to the ground potential, the inter-bit-line capacitive coupling disturbs the bit line BL for the second read.

However, even in a read operation performed on such a multi-valued memory cell, the use of a nonvolatile semiconductor storage device configured and operated similarly to those described above in the embodiments allows effects similar to those described above in the embodiments to be exerted. That is, the bit line BL can be charged at a high speed. At the same time, the bit line BL for which the potential of the adjacent bit line BL fails to decrease can be restrained from being overcharged.

Seventh Embodiment

Now, a method will be described in which the sense module described in the first to sixth embodiments is arranged in a nonvolatile semiconductor storage device with a three-dimensional structure. Furthermore, in a seventh embodiment, a semiconductor integrated circuit with a three-dimensional stacked structure will be described.

<Summary of the Semiconductor Integrated Circuit with the Three-Dimensional Stacked Structure>

The three-dimensional stacked structure of the semiconductor integrated circuit is obtained by stacking a plurality of conductive layers comprising conductive polysilicon, on a semiconductor substrate. If a common NAND flash memory is applied to the semiconductor integrated circuit with the three-dimensional stacked structure (this is hereinafter sometimes referred to as a three-dimensional stacked NAND flash memory), memory cell arrays have a three-dimensional structure. However, peripheral circuits remain with two-dimensional structures.

<Basic Structure of the Semiconductor Integrated Circuit with the Three-Dimensional Stacked Structure>

First, the basic structure of the three-dimensional stacked NAND flash memory will be described with reference to FIG. 13. FIG. 13 is a perspective view of the three-dimensional stacked NAND flash memory.

As shown in FIG. 13, a nonvolatile semiconductor storage device (three-dimensional stacked NAND flash memory) 100 comprises a memory cell transistor area 12, a plurality of word lines WL, a plurality of select gate lines SG, a plurality of source lines SL, and a back gate BG. A control circuit comprises a word line driving circuit, a select gate driving circuit, a source line driving circuit, a bit line control circuit, and a back gate transistor driving circuit, though this is not shown in FIG. 13.

The memory cell transistor area 12 in FIG. 13 is almost synonymous with the above-described memory cell array. By way of example of the present embodiment, the control circuit is arranged outside the memory cell transistor area 12 (memory cell array).

The plurality of word lines WL, the plurality of bit lines BL, the plurality of source lines SL, the back gate BG, and the plurality of select gates SG are provided in the memory cell transistor area 12. In the memory cell transistor area 12, memory cell transistors configured to store data are arranged at the respective intersections of the stacked plurality of word lines WL and U-shaped silicon pillars SP described below. FIG. 13 shows an example in which four layers of the word lines WL are stacked. However, the present embodiment is not limited to this configuration.

The word line driving circuit (not shown in the drawings) is connected to the word lines WL to control voltages applied to the word lines WL. Furthermore, wires that connect the word line driving circuit to the word lines WL are formed in wiring layers at the same level. However, the present embodiment is not limited to this structure. The wires may be formed in wiring layers at different levels. Additionally, the bit line driving circuit controls voltages applied to the bit lines BL.

The source line driving circuit (not shown in the drawings) is connected to the source lines SL to control voltages applied to the source lines SL. The source line driving circuit is connected to all the source lines SL. However, the present embodiment is not limited to this structure. One source line driving circuit may be provided for each of the source lines SL.

The back gate driving circuit (not shown in the drawings) is connected to the back gate BG to control a voltage applied to the back gate BG.

The select gate driving circuit (not shown in the drawings) is connected to the select gates SG to control voltages applied to the select gates SG.

Figure 14:
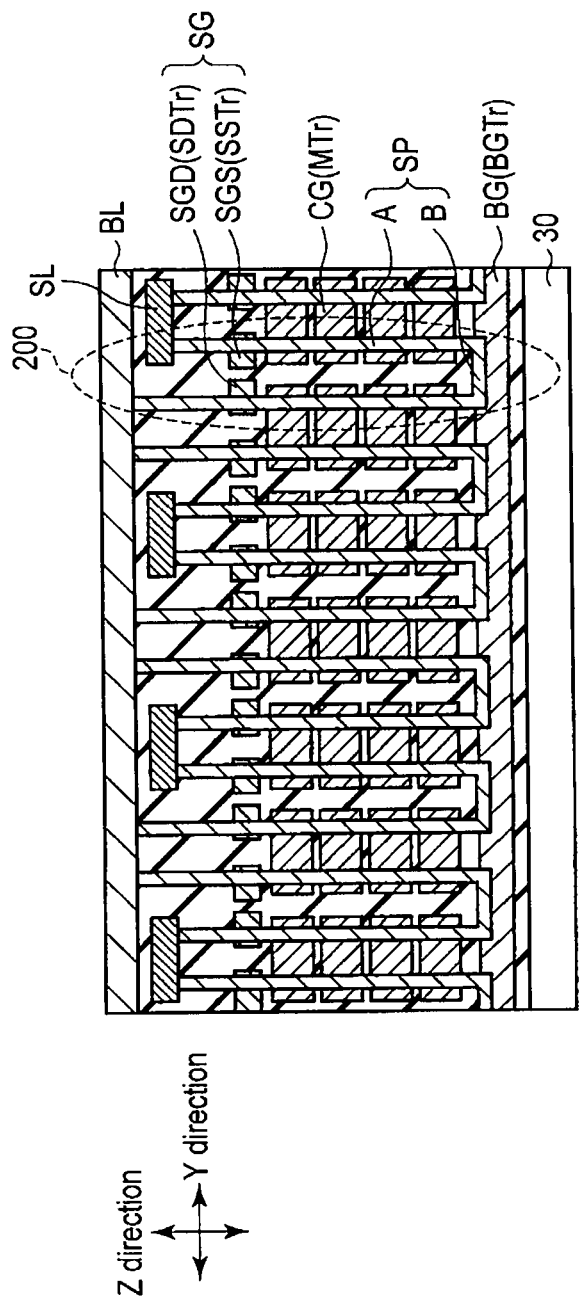
FIG. 14 is a cross-sectional view of a semiconductor storage device according to the seventh embodiment.

FIG. 14 is a cross-sectional view taken along a column (Y) direction of the memory cell transistor area 12 shown in FIG. 13. FIG. 14 shows the structure of the memory cell transistor area 12 according to the seventh embodiment. FIG. 15 is an enlarged view of a NAND string shown in FIG. 14.

As shown in FIG. 14, in the memory cell transistor area 12, a plurality of NAND strings (memory cell strings) 200 comprising U-shaped silicon pillars SP are formed on a substrate 30. Each NAND string 200 comprises a plurality of memory cell transistors MTr and two select transistors (drain side select transistor SDTr and source side select transistor SSTr) formed at respective opposite ends of the memory cell transistors MTr.

Each of the plurality of memory cell transistors MTr is formed at a corresponding one of the intersection of the U-shaped silicon pillar SP and a plurality of control gates CG (word lines WL). Current paths in the memory cell transistors MTr are connected together in series.

As shown in FIG. 15, each of the memory cell transistors MTr comprises a memory film 324 between the U-shaped silicon pillar SP and the control gate CG. The memory film 324 comprises a tunnel insulating film 322, a charge accumulation layer 321, and a block insulating layer 320 formed in order around the U-shaped silicon pillar SP. That is, each memory cell transistor MTr has a MONOS structure. The MONOS structure refers to a memory cell structure in which the charge accumulation layer comprises an insulator such as a nitride. Here, the charge accumulation layer has a multilayer structure (charge trap layers); in this example, an ONO (oxide/nitride/oxide) structure.

The drain side select transistor SDTr is formed at the intersection of the U-shaped silicon pillar SP and the drain side select gate SGD. On the other hand, the source side select transistor SSTr is formed at the intersection of the U-shaped silicon pillar SP and the source side select gate SGS.

As shown in FIG. 15, the drain side select transistor SDTr and the source side select transistor SSTr each comprise a MONOS structure similarly to the memory cell transistor MTr. Furthermore, the drain side select transistor SDTr and the source side select transistor SSTr may each comprise an oxide film.

Additionally, the drain side select transistor SDTr and the source side select transistor SSTr are formed over the plurality of memory cell transistors MTr. In addition, the source side select transistor SSTr is connected, at one end thereof, to one end of the group of the plurality of memory cell transistors, and at the other end thereof, to the source line SL. On the other end, the drain side select transistor SDTr is connected, at one end thereof, to the other end of the group of the plurality of memory cell transistors, and at the other end thereof, to the bit line BL.

The U-shaped silicon pillar SP is formed to appear U-shaped in cross section in the column direction (Y direction). The U-shaped silicon pillar SP comprises paired columnar portions A extending in a stack direction (Z direction) and a pipe portion B formed to couple lower ends of the paired columnar portions A. The pipe portion B is provided in the back gate BG to form a back gate transistor BGTr. Furthermore, the U-shaped silicon pillars SP are arranged such that a straight line joining the central axes of the paired columnar portions A together is parallel to the column direction. Additionally, the U-shaped silicon pillars SP are arranged in a matrix in a plane formed of a row direction (X direction) and the column direction.

Moreover, as shown in FIG. 15, the U-shaped silicon pillar SP comprises a hollow H1 in which an insulating portion 325 is filled.

The plurality of control gates CG are stacked above the back gate BG and arranged to cross the columnar portions A of the U-shaped silicon pillar SP at right angles. The control gates CG extend parallel to the row direction. Furthermore, each of the control gates CG is formed to be shared by the two adjacent columnar portions A of the U-shaped silicon pillars SP in the two NAND strings 200 adjacent to each other in the column direction FIG. 14 shows an example in which 16 control gates CG are stacked. However, the present embodiment is not limited to this configuration.

The back gate BG is provided below the lowermost word line WL. The back gate BG is formed to spread two-dimensionally in the row direction and the column direction so as to cover the pipe portions B of the U-shaped silicon pillars SP.

The drain side select transistor SGD and the source side select transistor SGS are provided above the uppermost control gate CG. The drain side select transistor SGD and the source side select transistor. SGS extend parallel to the row direction. Furthermore, the drain side select transistor SGD and the source side select transistor SGS are formed to cross the pillar portions A of the U-shaped silicon pillar SP; the drain side select transistor SGD and the source side select transistor SGS are isolated from each other in the column direction in a line-and-space manner.

The source lines SL is provided above the select gates SG. Each source line SL is formed so as to be shared by the two adjacent columnar portions A of the U-shaped silicon pillars SP in the two NAND strings 200 adjacent to each other in the column direction. The source lines SL extend parallel to the row direction and are isolated from one another in the column direction in a line-and-space manner.

The plurality of bit lines BL are provided above the source line SL. The bit lines extending in the column direction are formed to be isolated from each other in the column direction in a line-and-space manner.

<Arrangement of the Bit Line Control Circuit>

Now, with reference to FIG. 16A, FIG. 16B, and FIG. 16C, an example of arrangement of a bit line control circuit (which may hereinafter simply be referred to as a sense amplifier or S/A) 32 (or 32a and 32b) will be described in brief. FIG. 16A, FIG. 16B, and FIG. 16C are block diagrams schematically showing the positional relationship between the bit line control circuit and the memory cell array. FIG. 16A shows a case where the bit line control circuit is arranged on one side of the memory cell array. FIG. 16B shows a case where the bit line control circuit is arranged on each of the opposite sides of the memory cell array and where every other line BL is connected to an input side of the same bit line control circuit. FIG. 16C shows a case where the bit line control circuit is arranged on each of the opposite sides of the memory cell array and where every two bit lines BL are alternately connected to the input sides of the two bit line control circuits.

As shown in FIG. 16A, the bit line control circuit 32 is formed only on one side of the memory cell array 31. In this case, all the bit lines BL in the memory cell array 31 are connected to the bit line control circuit 32. Thus, the bit line control circuit 2 in each of the above-described embodiments can be easily applied to this configuration.

As shown in FIG. 16B, the bit line control circuit is divided into the bit line control circuits 32a and 32b, with the memory cell array 31 sandwiched between the bit line control circuits 32a and 32b. Every other bit line BL in the memory cell array 31 is connected to the same bit line control circuit. Specifically, every other bit line BL is connected to the bit line control circuit 32a. The bit line BL adjacent to each bit line BL connected to the bit line control circuit 32a is connected to the bit line control circuit 32b opposite to the bit line control circuit 32a.

As shown in FIG. 16C, the bit line control circuit is divided into the bit line control circuits 32a and 32b, with the memory cell array 31 sandwiched between the bit line control circuits 32a and 32b. Every two bit lines BL in the memory cell array 31 are alternately connected to the two bit line control circuits. Specifically, every two bit lines BL are alternately connected to the bit line control circuits 32a and 32b.

Figure 17:
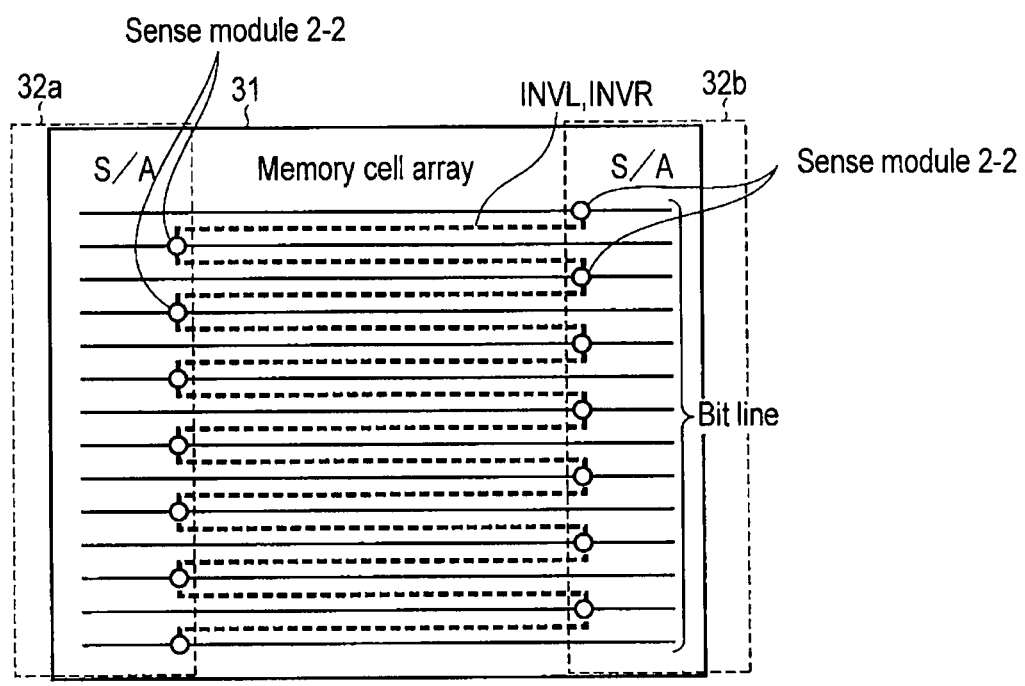
FIG. 17 is a block diagram schematically showing an example in which sense modules are connected together according to the seventh embodiment.

Now, with reference to FIG. 17, an example of the connection between the sense modules will be described where every other bit line BL is connected to the input side of the same bit line control circuit (see FIG. 16B). FIG. 17 is a block diagram schematically showing the example of the connection between the sense modules.

As shown in FIG. 17, if the bit line BL of interest is connected to a sense module 2-2 in the bit line control circuit 32a, the bit line BL adjacent to the bit line BL of interest is connected to the sense module 32b in the bit line control circuit 32. Thus, signal (INVL, INVR, LATL, LATR, and the like) lines from a data latch section 2-5 in the sense module 2-2 in the bit line control circuit 32b are extended as shown by dashed lines in FIG. 17. Thus, signals through the signal lines are supplied to an accelerator 2-4 in the sense module 2-2 in the bit line control circuit 32a. Similarly, signal (INVL, INVR, LATL, LATR, and the like) lines from the data latch section 2-5 in the sense module 2-2 in the bit line control circuit 32a are extended as shown by dashed lines in FIG. 17. Thus, signals through the signal lines are supplied to the accelerator 2-4 in the sense module 2-2 in the bit line control circuit 32b.

Figure 18:
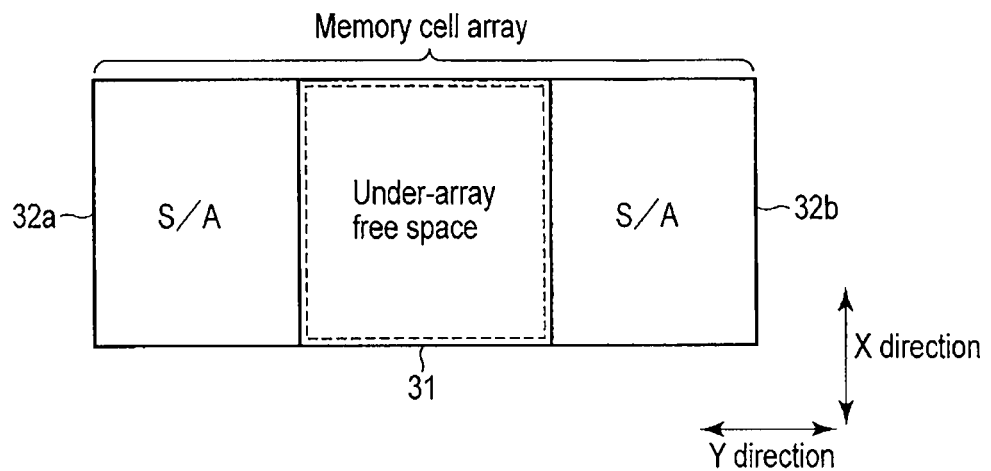
FIG. 18 is a block diagram schematically showing the positional relationship between the bit line control circuit and the memory cell array according to the seventh embodiment.

Now, with reference to FIG. 18, a case will be described in brief where the bit line control circuit is divided into two bit line control circuits 32a and 32b (arranged on the opposite sides). FIG. 18 is a block diagram schematically showing the positional relationship between the bit line control circuits and the memory cell array. In FIG. 18, a semiconductor substrate surface is seen from above.

As shown in FIG. 18, the bit line control circuits 32a and 32b are embedded under the memory cell array 3. Furthermore, in the Y direction, the bit line control circuits 32a and 32b are arranged at the respective opposite ends of the memory cell array 31. Thus, a free space (referred to as an under-array free space or the like) is formed under the memory cell array 31. As described above, the wires (INVL, INVR, LATL, LATR, and the like) between the bit line control circuits are formed in the under-array free space. Increasing miniaturization of the memory cell array 31 means a reduction in the distance between the bit line control circuits 32a and 32b.

Figure 19:
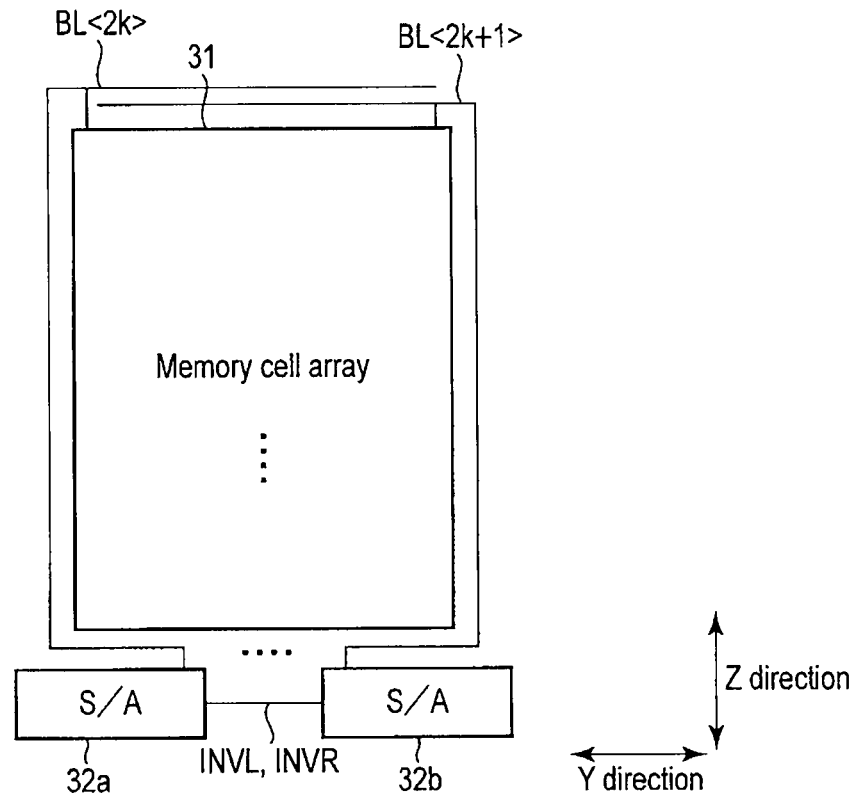
FIG. 19 is a block diagram schematically showing the positional relationship between the bit line control circuit and the memory cell array according to the seventh embodiment.

Now, examples of the position where the bit line control circuit is embedded and the wiring of the bit lines BL will be described in brief with reference to FIG. 19. FIG. 19 is a block diagram schematically showing the positional relationship between the bit line control circuit and the memory cell array.

In this example, the bit lines BL are connected to the bit line control circuit via the outside of the memory cell array 31.

As shown in FIG. 19, the bit line control circuit 32a is arranged at one end of the memory cell array 31 in the Y direction. The bit line control circuit 32b is arranged at the other end of the memory cell array 31 in the Y direction. Bit lines BL<0>, <2k>, ..., BL<m> are arranged in the cell array 31 and connected to the bit line control circuit 32a. Bit lines BL<1>, <2k−1>, ..., BL<m−1> are also arranged in the cell array 31 and connected to the bit line control circuit 32b.

In this case, the bit lines BL extend out from the memory cell array 31 at ends of the array 31 in the Y direction and at an upper end of the array 31 in the Z direction (the direction perpendicular to the substrate surface). Then, the bit lines BL extend along the Z direction via the outside of the memory cell array 31 and connect to the bit line control circuit 32a or 32b. At this time, for the specification of the bit line control circuits 32a and 32b, the bit lines BL need to pass between the memory cell array 31 and the bit line control circuit 32a or 32b along the Y direction. In this manner, the bit lines BL are connected to the bit line control circuit 32a or 32b.

Figure 20:
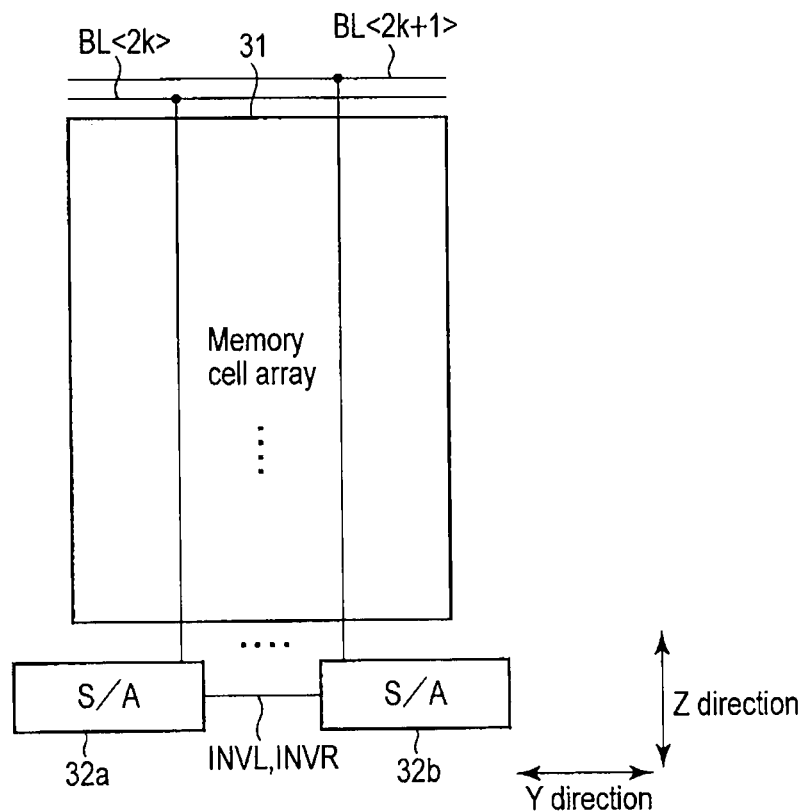
FIG. 20 is a block diagram schematically showing the positional relationship between the bit line control circuit and the memory cell array according to the seventh embodiment.

Now, other examples of the position where the bit line control circuit is embedded and the wiring of the bit lines BL will be described in brief with reference to FIG. 20. FIG. 20 is a block diagram schematically showing the positional relationship between the bit line control circuit and the memory cell array.

In this example, the bit lines BL are connected to the bit line control circuit via the inside of the memory cell array 31.

As shown in FIG. 20, the bit line control circuit 32a is arranged at one end of the memory cell array 31 in the Y direction. The bit line control circuit 32b is arranged at the other end of the memory cell array 31 in the Y direction. The bit lines BL<0>, <2k>, ..., BL<m> are arranged in the cell array 31 and connected to the bit line control circuit 32a. The bit lines BL<1>, <2k−1>, ..., BL<m−1> are also arranged in the cell array 31 and connected to the bit line control circuit 32b.

In this case, the bit lines BL pass through the inside (interior) of the memory cell array 31 and extend out from the memory cell array 31 at a position close to a bit line connection end and at a lower end of the array 31 in the Z direction (the direction perpendicular to the substrate surface). In this case, a through-hole for the bit lines BL is formed in a lower surface area of the memory cell array 31. The bit lines BL are then connected to the bit line control circuit 32a or 32b arranged below the memory cell array 31. In this case, the length of the bit lines BL between the memory cell array 31 and the bit line control circuit is shorter than in the example described in FIG. 19. This enables possible delay or the like to be prevented during charging.

Effects of the Seventh Embodiment

According to the above-described embodiment, the non-volatile semiconductor storage device further comprises the memory cell array 31 with a plurality of (columnar) memory strings connected together in series perpendicularly to the upper surface of the semiconductor substrate 21 (in the Z direction). A first clamp transistor 2-21, a voltage controller 2-4, a sense amplifier 2-3, a data latch section 2-5, a pull down circuit 2-6, and a charging control circuit 2-1 are provided below the memory cell array 31. The bit line BL extends from an upper surface area of the memory cell array 31 through the outside of the memory cell array 31 along the perpendicular direction (Z direction). The bit line BL is then connected to one end of the current path in the first clamp transistor 2-21. Furthermore, the bit line BL is connected to one end of the current path in the first clamp transistor 2-21 via the through-hole formed in the lower surface area of the memory cell array 31.

Furthermore, the following may be arranged below the memory cell array and at the respective opposite ends thereof: the group of the first clamp transistor 2-21, the voltage controller 2-4, the sense amplifier 2-3, the data latch section 2-5, the pull down circuit 2-6, and the charging control circuit 2-1, and a group of another first clamp transistor 2-21, another voltage controller 2-4, another sense amplifier 2-3, another data latch section 2-5, another pull down circuit 2-6, and another charging control circuit 2-1. However, even in this case, the above-described configuration allows each of the above-described embodiments to be applied.

Thus, the configuration and operation of the above-described seventh embodiment are similar to those of each of the above-described embodiments. Therefore, the seventh embodiment can exert effects similar to those of the above-described embodiments.

Comparative Example

Now, the configuration of a sense module 2-7 according to a comparative example will be described with reference to FIGS. 21 to 26.

Figure 21:
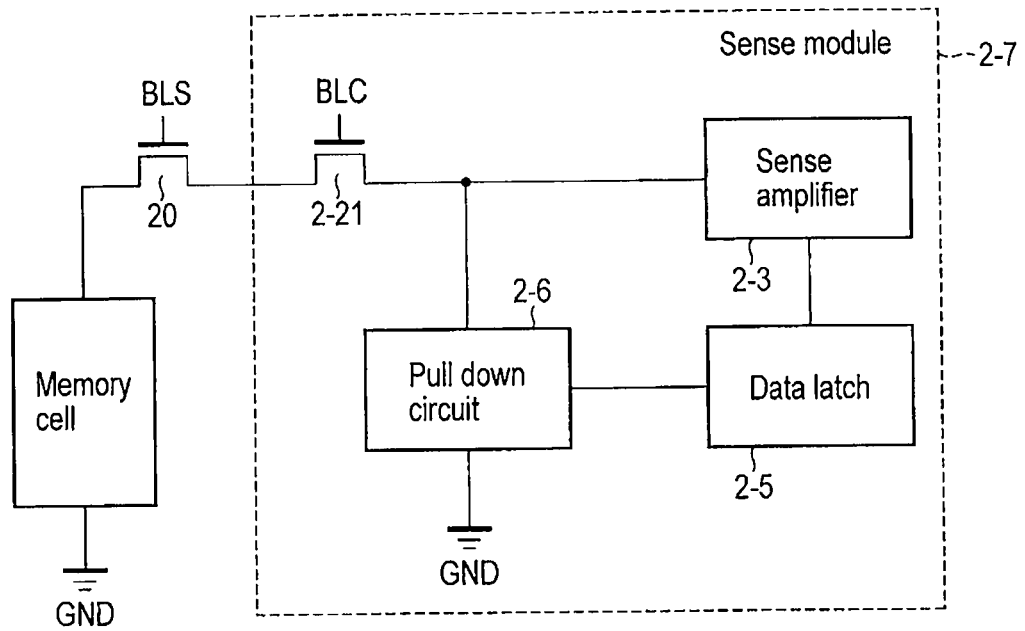
FIG. 21 is a circuit diagram schematically showing a basic configuration of a sense module according to a comparative example.

Now, the basic configuration of the sense module 2-7 according to the comparative example will be described in brief with reference to FIG. 21. FIG. 21 is a circuit diagram schematically showing the basic configuration of the sense module 2-7 according to the comparative example.

As shown in FIG. 21, the sense module 2-7 comprises a bit clamping NMOS transistor 2-21, a sense amplifier 2-3, a data latch 2-5, and a pull down circuit 2-6. Furthermore, the sense module 2-2 is connected to a memory cell via a bit line select transistor 20. A bit select signal BLS is input to a gate of the bit line select transistor 20, which thus controllably turns on and off the memory cell MC and the sense module 2-2. The signal BLS is provided by a control circuit 7.

Now, with reference to FIG. 21, FIG. 22, and FIG. 23, a case will be described where the potential of a bit line BL decreases to the ground potential during a read operation. FIG. 22 is a circuit diagram schematically showing sense modules and bit lines according to the comparative example. FIG. 23 is a timing chart illustrating a charging operation of a semiconductor device according to the comparative example.

As shown in FIG. 22, bit lines BL0 and BL1 are adjacent to each other. Bit lines BL1 and BL2 are adjacent to each other. Bit lines BL2 and BL3 are not adjacent to each other. A current Isa0 is supplied to the bit line BL0 by the sense module 2-2. A current Isa1 is supplied to the bit line BL1 by the sense module 2-2. A current Isa2 is supplied to the bit line BL2 by the sense module 2-2. A current Isa3 is supplied to the bit line BL3 by the sense module 2-2.

As shown in FIG. 22 and FIG. 23, during a read operation, when the potential of a bit line BL to which a memory cell with read completed thereon belongs is set equal to the ground potential, the inter-bit-line BL parasitic capacitance acts to reduce the potential of an adjacent bit line BL (with read not completed thereon yet).

Thus, at a point of time t1, the following takes place.

(1) Read is completed on the bit lines BL0 and BL2, the potentials of which are reduced from VBL down to the ground potential GND.

(2) The inter-bit-line BC parasitic capacitance acts to reduce the potential of the bit line BL1 of interest.

(3) While the bit line BL1 of interest with the reduced potential is being charged, Isa1>Icell. When read (sensing) is carried out during the charging, a current as seen from the sense module includes not only a cell current but also a bit line charging current. This may lead to misreads.

(4) Thus, the operation needs to wait until Isa1 settles down to a predetermined value.

According to the above-described comparative example, to avoid such misreads, the read is not started until the charging ends. This may disadvantageously degrade performance.

In the above-described embodiments, the memory cell configured to store 4-level data has been described in connection with multi-valued memory cells each of which is configured to store least 2 bits of data. However, the present embodiment is not limited to this configuration. The above-described embodiments are applicable to memory cells configured to store higher-level data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   electrically rewritable memory cells;
   word lines each electrically connected to gates of the memory cells;
   bit lines each electrically connected to one end of a corresponding one of the memory cells;
   voltage controllers each comprising a switch circuit, the voltage controller being electrically connected to the bit line;
   sense amplifiers each electrically connected to the corresponding voltage controller;
   first transistors each electrically connected between the corresponding bit line and the corresponding sense amplifier;
   data latch sections each electrically connected to the corresponding sense amplifier to hold first data before reading operation on the corresponding memory cell and to hold second data if a current equal to or a larger than a first value flows via the corresponding bit line;
   pull down circuits each configured to reduce a potential of the corresponding bit line to a reset potential if the second data is held in the corresponding data latch section; and
   charging control circuits each configured to apply potentials to gates of the corresponding first transistor in reading operation on the corresponding memory cell,
   wherein the switch circuit is turned on or off depending on the data held in another data latch section electrically connected to another bit line located adjacently in a direction of the word lines, to control a connection between the bit line and the sense amplifier via the voltage controller.

2. The device according to claim 1, wherein the switch circuit is turned on if the second data is held in at least one, another data latch section electrically connected to another bit line located adjacently in the direction of the word lines.

3. The device according to claim 1, wherein the switch circuit is turned on if the second data is held in two other data latch sections electrically connected to other bit lines located adjacently in the direction of the word lines.

4. The device according to claim 1, wherein the voltage controller further comprises a second transistor, one end of a current path in the second transistor is connected to the first transistor, and another end of the current path in the second transistor is connected to the switch circuit, and
   the switch circuit comprises a third transistor with a gate to which the data held in another data latch section electrically connected to another bit line located adjacently in the direction of the word lines is input and a fourth transistor with a gate to which the data held in yet another data latch section electrically connected to yet another bit line located adjacently in the direction of the word lines is input.

5. The device according to claim 4, wherein one end of a current path in the third transistor is connected to one end of a current path in the fourth transistor, and another end of the current path in the third transistor is connected to another end of the current path in the fourth transistor, and
   the third transistor or the fourth transistor is turned on to allow the second transistor to charge the bit line via the voltage controller.

6. The device according to claim 4, wherein one end of a current path in the third transistor is connected to one end of a current path in the fourth transistor, and another end of the current path in the third transistor is connected to another end of the current path in the second transistor, and the third transistor and the fourth transistor are turned on to allow the second transistor to charge the bit line via the voltage controller.

7. The device according to claim 1, wherein the voltage controller further comprises a second transistor, one end of a current path in the second transistor is connected to the first transistor, and another end of the current path in the second transistor is connected to the switch circuit, when read is carried out on the memory cell, the first transistor charges the bit line, and the switch circuit is further turned on to allow the second transistor to charge the bit line, and an output voltage from the first transistor is substantially equal to an output voltage from the second transistor.

8. The device according to claim 1, wherein the voltage controller further comprises a second transistor, one end of a current path in the second transistor is connected to the first transistor, and another end of the current path in the second transistor is connected to the switch circuit, and a third transistor with a current path connected, at one end thereof, to one end of a current path in the second transistor and with a gate connected to the second transistor, the switch circuit comprises a fourth transistor with a current path connected, at one end thereof, to another end of the current path in the second transistor, and a fifth transistor with a current path connected, at one end thereof, to another end of the third transistor, and at another end thereof, to another end of the fourth transistor, and if the second data is not held in another data latch section electrically connected to another bit line located adjacently in the direction of the word lines, the fourth transistor and the fifth transistor are turned off, and if the second data is held in the other data latch section electrically connected to another bit line located adjacently in the direction of the word lines, the fourth transistor is turned on, and if the second data is held in yet another data latch section electrically connected to yet another bit line located adjacently in the direction of the word lines, the fifth transistor is turned on.

9. The device according to claim 8, wherein when read is carried out on the memory cell, the first transistor charges the bit line, the fourth transistor is turned on to allow the second transistor to charge the bit line, and the fifth transistor is further turned on to allow the third transistor to charge the bit line, and an output voltage from the first transistor, an output voltage from the second transistor, and an output voltage from the third transistor are substantially equal.

10. The device according to claim 1, wherein the sense amplifier comprises a power supply circuit configured to supply a first voltage to the first transistor and the voltage controller depending on the data held in the data latch section, and a data sense circuit configured to supply the first data or the second data to the data latch circuit using the first voltage supplied by the power supply circuit.

11. The device according to claim 10, wherein the voltage controller receives the first voltage from the power supply circuit, and supplies second voltage to the bit line if the switch circuit is on.

12. The device according to claim 11, wherein the voltage controller further comprises a second transistor, one end of a current path in the second transistor is connected to the first transistor, and another end of the current path in the second transistor is connected to the switch circuit, and the switch circuit comprises a third transistor with a gate to which the data held in another data latch section electrically connected to another bit line located adjacently in the direction of the word lines is input and a fourth transistor with a gate to which the data held in yet another data latch section electrically connected to yet another bit line located adjacently in the direction of the word lines is input.

13. The device according to claim 12, wherein one end of a current path in the third transistor is connected to one end of a current path in the fourth transistor, and another end of the current path in the third transistor is connected to another end of the current path in the fourth transistor, and the third transistor or the fourth transistor is turned on to allow the second transistor to charge the bit line via the voltage controller.

14. The device according to claim 11, wherein the switch circuit comprises a third transistor with a gate to which a reversal potential of the data held in another data latch section electrically connected to another bit line located adjacently in the direction of the word lines is input and a fourth transistor with a gate to which a reversal potential of the data held in yet another data latch section electrically connected to yet another bit line located adjacently in the direction of the word lines is input.

15. The device according to claim 14, wherein one end of a current path in the third transistor is connected to one end of a current path in the fourth transistor, and another end of the current path in the third transistor is connected to another end of the current path in the fourth transistor, and the third transistor or the fourth transistor is turned on to allow the second transistor to charge the bit line via the voltage controller.

16. The device according to claim 1, further comprising a memory cell array including a plurality of memory strings each with the memory cells connected together in series perpendicularly to an upper surface of a substrate, wherein the first transistor, the voltage controller, the sense amplifier, the data latch circuit, the pull down circuit, and the charging control circuit are provided below the memory cell array, and the bit line extends from an upper surface area of the memory cell array and via an outside of the memory cell array along the perpendicular direction, and is connected to one end of the current path in the first transistor.

17. The device according to claim 1, further comprising a memory cell array including a plurality of memory strings each with the memory cells electrically connected together in series perpendicularly to an upper surface of a substrate, wherein the first transistor, the voltage controller, the sense amplifier, the data latch circuit, the pull down circuit, and the charging control circuit are provided below the memory cell array, and the bit line extends from a lower surface area of the memory cell array and is connected to one end of the current path in the first transistor.

18. A semiconductor storage device comprising:
a first bit line electrically connected to a first memory cell;
a second bit line electrically connected to a second memory cell and located adjacent to the first bit line;
a first holding circuit configured to be able to hold first data indicating that read has not been carried out on the first memory cell yet and second data indicating that read has been carried out on the first memory cell;

a second holding circuit configured to be able to hold first data indicating that read has not been carried out on the second memory cell yet and second data indicating that read has been carried out on the second memory cell; and a first sense section configured to charge the first bit line when read is carried out on the first memory cell, wherein the first sense section charges the first bit line using a plurality of current paths depending on the data in the second holding circuit, the sense section charges the first bit line using a first number of current paths if the first data is held in the second holding circuit, and the sense section charges the first bit line using a second number of current paths if the second data is held in the second holding circuit, the second number being larger than the first number.

19. The device according to claim 1, wherein the pull down circuit holds a potential of the corresponding bit line if the first data is held in the corresponding data latch section.

\* \* \* \* \*